(12) United States Patent
Hirayama et al.

(10) Patent No.: US 7,541,138 B2
(45) Date of Patent: Jun. 2, 2009

(54) RESIST COMPOSITION

(75) Inventors: Taku Hirayama, Kawasaki (JP); Hideo Hada, Kawasaki (JP); Satoshi Fujimura, Kawasaki (JP); Takeshi Iwai, Kawasaki (JP); Mitsuru Sato, Kawasaki (JP); Ryoichi Takasu, Kawasaki (JP); Toshikazu Tachikawa, Kawasaki (JP); Jun Iwashita, Kawasaki (JP); Keita Ishiduka, Kawasaki (JP); Tomotaka Yamada, Kawasaki (JP); Toshikazu Takayama, Kawasaki (JP); Masaaki Yoshida, Kawasaki (JP)

(73) Assignee: Tokyo Ohka Kogyo Co., Ltd., Kawasaki (JP)

( * ) Notice: Subject to any disclaimer, the term of this patent is extended or adjusted under 35 U.S.C. 154(b) by 0 days.

(21) Appl. No.: 11/621,895

(22) Filed: Jan. 10, 2007

(65) Prior Publication Data

US 2007/0190436 A1    Aug. 16, 2007

Related U.S. Application Data

(63) Continuation of application No. 10/845,620, filed on May 13, 2004, which is a continuation-in-part of application No. PCT/JP2004/00704, filed on Jan. 27, 2004.

(30) Foreign Application Priority Data

| | | |
|---|---|---|
| Jan. 31, 2003 | (JP) | 2003-025152 |
| Feb. 21, 2003 | (JP) | 2003-045000 |
| Mar. 7, 2003 | (JP) | 2003-062531 |
| Apr. 30, 2003 | (JP) | 2003-125244 |
| Jun. 2, 2003 | (JP) | 2003-157257 |
| Jul. 10, 2003 | (JP) | 2003-195403 |
| Dec. 24, 2003 | (JP) | 2003-426939 |
| Jan. 26, 2004 | (JP) | 2004-017355 |

(51) Int. Cl.
*G03F 7/30* (2006.01)

(52) U.S. Cl. .................. 430/326; 430/270.1; 430/330; 430/905; 430/910; 436/5

(58) Field of Classification Search .................. 355/30, 355/53, 67, 27; 430/270.1, 311, 281.1; 436/5
See application file for complete search history.

(56) References Cited

U.S. PATENT DOCUMENTS

| | | | |
|---|---|---|---|
| 4,276,365 A | 6/1981 | Yoneda et al. | |
| 5,104,479 A | 4/1992 | Kotachi et al. | |
| 5,610,683 A | 3/1997 | Takahashi | |
| 5,733,704 A | 3/1998 | Choi et al. | |
| 5,849,826 A | 12/1998 | Ogo et al. | |
| 5,916,728 A | 6/1999 | Fukui et al. | |
| 5,929,271 A | 7/1999 | Hada et al. | |
| 6,004,047 A | 12/1999 | Akimoto et al. | |
| 6,005,030 A | 12/1999 | Togawa et al. | |
| 6,027,856 A | 2/2000 | Nozaki et al. | |
| 6,057,083 A | 5/2000 | Taylor et al. | |
| 6,063,896 A | 5/2000 | Jung et al. | |
| 6,077,643 A | 6/2000 | Kumar et al. | |
| 6,239,231 B1 | 5/2001 | Fujishima et al. | |
| 6,303,266 B1 | 10/2001 | Okino et al. | |
| 6,383,713 B1 | 5/2002 | Uetani et al. | |
| 6,444,397 B2 | 9/2002 | Hada et al. | |
| 6,475,699 B2 | 11/2002 | Uetani et al. | |
| 6,479,211 B1 | 11/2002 | Sato et al. | |
| 6,495,306 B2 | 12/2002 | Uetani et al. | |
| 6,548,221 B2 | 4/2003 | Uetani et al. | |
| 6,660,450 B2 | 12/2003 | Okino et al. | |
| 6,723,392 B1 | 4/2004 | Jinnai et al. | |

(Continued)

FOREIGN PATENT DOCUMENTS

EP    0605103 B1    10/1998

(Continued)

OTHER PUBLICATIONS

Wolfe, Karen. Phosphoric Acid as a High-Index Immersion Fluid. 22nd Annual Microelectronic Enginereing Conference, May 10-12, 2004. Rochester Institute of Technology, pp. 40-43 http://www.microe.rit.edu/ameccontent/8_Wolf.pdf and http://www.microe.rit.edu/pdf/22/announce.pdf accessed on Apr. 10, 2008.*

(Continued)

*Primary Examiner*—John S Chu
(74) *Attorney, Agent, or Firm*—Knobbe, Martens, Olson & Bear, LLP

(57) ABSTRACT

A resist composition which is stable relative to solvents used in immersion lithography processes and displays excellent sensitivity and resist pattern profile, and a method of forming a resist pattern that uses such a resist composition are provided. The resist composition is in accordance with predetermined parameters, or is a positive resist composition comprising a resin component (A) which contains an acid dissociable, dissolution inhibiting group and displays increased alkali solubility under the action of acid, an acid generator component (B), and an organic solvent (C), wherein the component (A) contains a structural unit (a1) derived from a (meth)acrylate ester containing an acid dissociable, dissolution inhibiting group, but contains no structural units (a0), including structural units (a0-1) containing an anhydride of a dicarboxylic acid and structural units (a0-2) containing a phenolic hydroxyl group.

3 Claims, 5 Drawing Sheets

U.S. PATENT DOCUMENTS

| | | | |
|---|---|---|---|
| 6,746,818 | B2 | 6/2004 | Kinsho et al. |
| 6,809,794 | B1 | 10/2004 | Sewell |
| 6,844,206 | B1 | 1/2005 | Phan et al. |
| 6,992,015 | B2 | 1/2006 | Endo et al. |
| 2001/0014428 | A1 | 8/2001 | Uetani et al. |
| 2002/0068238 | A1 | 6/2002 | Hada et al. |
| 2002/0102492 | A1 | 8/2002 | Iwai et al. |
| 2003/0044715 | A1 | 3/2003 | Fujimori et al. |
| 2004/0125351 | A1* | 7/2004 | Krautschik ........... 355/53 |
| 2004/0259008 | A1* | 12/2004 | Endo et al. ........... 430/31 |
| 2005/0243291 | A1* | 11/2005 | Kim .................. 355/30 |

FOREIGN PATENT DOCUMENTS

| | | |
|---|---|---|
| EP | 0917000 A2 | 5/1999 |
| JP | 53-53314 | 5/1978 |
| JP | 62-065326 | 3/1987 |
| JP | 62-065352 | 3/1987 |
| JP | 62-134644 | 6/1987 |
| JP | H07-209275 | 8/1995 |
| JP | H10-335221 | 12/1998 |
| JP | 11-176727 | 7/1999 |
| JP | 2000-058436 | 2/2000 |
| JP | 2000-121498 | 4/2000 |
| JP | 2000-137327 | 5/2000 |
| JP | 2000-338674 | 12/2000 |
| JP | 2001-183836 | 7/2001 |
| JP | 2001349816 | 12/2001 |
| JP | 2002-043215 | 2/2002 |
| JP | 2002-057093 | 2/2002 |
| JP | 2002-169292 | 6/2002 |
| JP | 2002-303980 | 10/2002 |
| TW | 411405 | 11/2000 |
| TW | 422942 | 2/2001 |
| TW | 455699 | 9/2001 |
| TW | 466382 | 12/2001 |
| TW | 472068 | 1/2002 |
| TW | 495535 | 7/2002 |
| WO | WO 99/49504 | 9/1999 |
| WO | WO 03/048863 | 12/2003 |

OTHER PUBLICATIONS

Hoffnagle et al., "Liquid immersion deep-ultraviolet interferometric lithography", *Journal of Vacuum Science & Technology B*, 1999, vol. 17(6), pp. 3306-3309.

Switkes et al., "Immersion lithography at 157 nm", *Journal of Vacuum Science & Technology B*, 2001, vol. 19(6), pp. 2353-2356.

Switkes et al., "Resolution Enhancement of 157 nm Lithography by Liquid Immersion", Proceedings of SPIE, 2002, vol. 4691, pp. 459-465.

Singapore Search Report received Jul. 9, 2007 for Singapore Patent Application No. 200508430-6 and attached date stamped letter.

Piscani et al., *A Review of Material Issues in Immersion Lithography*, Microlithography Materials, 1-12, (2005).

Office Action and Search Report received in connection with corresponding Taiwanese Application No. 093102028, dated Jan. 16, 2008.

Office Action and Search Report issued on Jul. 2, 2008, on the related Taiwanese Patent Application No. 094123917.

Office Action that issued on Jan. 20, 2009, on the counterpart Japanese Patent Applicaton No. 2005-186524.

Office Action that issued on Jan. 27, 2009, on the counterpart Japanese Patent Applicaton No. 2004-017355.

Decision to Grant a Patent that issued on Jan. 27, 2009, on the counterpart Japanese Patent Applicaton No. 2005-151253.

Switkes, M. et al. "Immersion Liquids for Lithography in the Deep Ultraviolet," Proceedings of SPIE, vol. 5040, pp. 690-699 (2003). [online], SPIE, [Search date: Jan. 15, 2009], Internet [http://spie.org/x648.html?product_id=460837&origin_id=x4325&start_volume_number=5000&end_volume_number=5099&start_at=41].

* cited by examiner

FIG.9

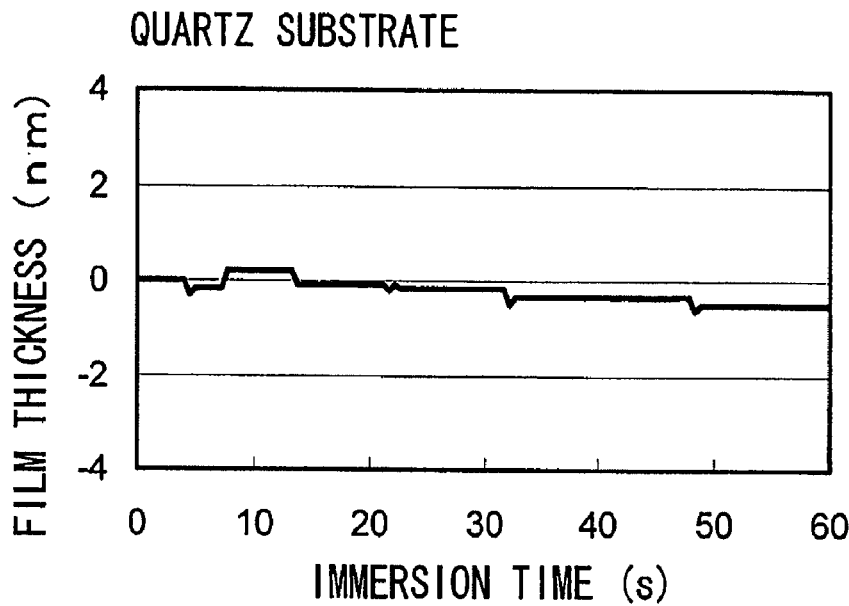

A SUBSTRATE WITH NO APPLIED RESIST WAS SUBJECTED TO WATER IMMERSION TESTING.

FIG.10

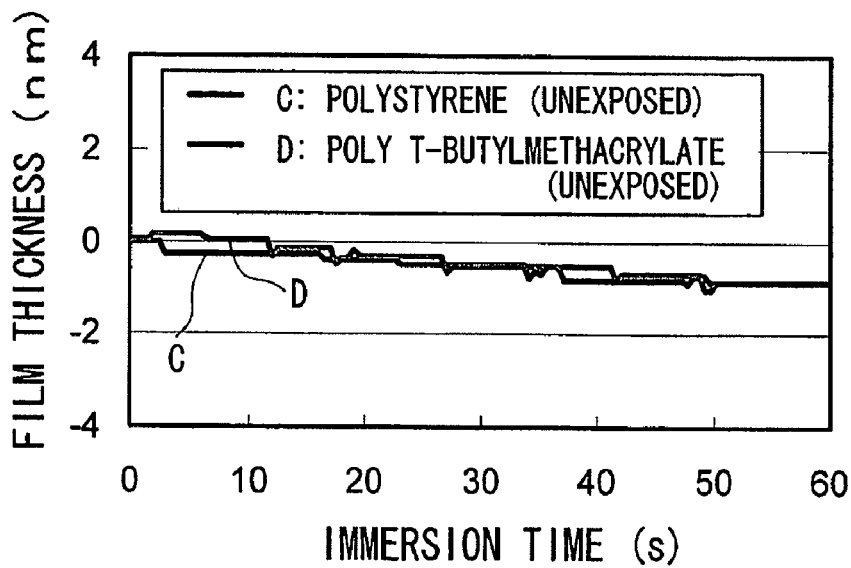

SUBSTRATES TO WHICH POLYSTYRENE OR POLY T-BUTYLMETHACRYLATE HAD BEEN APPLIED WERE SUBJECTED TO WATER IMMERSION TESTING. THE SOLVENT USED FOR THE SAMPLE SOLUTIONS WAS THE SAME MIXTURE OF ETHYL LACTATE AND PGMEA USED FOR THE OTHER SAMPLES. ALL OTHER CONDITIONS WERE THE SAME AS THOSE USED FOR THE OTHER TESTS.

RESIST COMPOSITION

RELATED APPLICATIONS

This application is a continuation of U.S. application Ser. No. 10/845,620, filed May 13, 2004, which is a continuation-in-part of PCT/JP2004/000704, filed Jan. 27, 2004, which claims priority to Japanese Patent Application Nos. 2003-025152 filed Jan. 31, 2003; 2003-045000 filed Feb. 21, 2003; 2003-062531 filed Mar. 7, 2003; 2003-125244 filed Apr. 30, 2003; 2003-157257 filed Jun. 2, 2003; 2003-195403 filed Jul. 10, 2003; 2003-426939 filed Dec. 24, 2003; and 2004-017355 filed Jan. 26, 2004, the contents of all of which are incorporated herein by reference.

BACKGROUND OF THE INVENTION

1. Field of the Invention

The present invention relates to a positive or negative resist composition used in a resist pattern formation method that comprises an immersion lithography (immersion exposure) step, and a method of forming a resist pattern that uses such a resist composition.

2. Description of Related Art

Lithography techniques are widely used in the production of microscopic structures in a variety of electronic devices such as semiconductor devices and liquid crystal devices, and ongoing miniaturization of these device structures has lead to demands for further miniaturization of the resist patterns used in these lithography processes.

With current lithography techniques, using the most up-to-date ArF excimer lasers, fine resist patterns with a line width of approximately 90 nm are able to be formed, but in the future even finer pattern formation will be required.

In order to enable the formation of ultra fine patterns of less than 90 nm, the development of appropriate exposure apparatus and corresponding resists is the first requirement. In terms of exposure apparatus, apparatus with shorter wavelength light sources such as $F_2$ lasers, EUV (extreme ultraviolet), electron beams and X-rays, or apparatus with larger lens numerical apertures (NA) are common.

However, reducing the wavelength of the light source requires a new and expensive exposure apparatus, and if the NA value is increased, then because the resolution and the depth of focus range exist in a trade-off type relationship, even if the resolution is increased, the depth of focus range reduces.

Against this background, a method known as immersion lithography has been reported (for example, see the non-patent reference 1, the non-patent reference 2, and the non-patent reference 3). This is a method in which, during exposure, the region between the lens and the resist layer disposed on top of the wafer, which has conventionally been filled with air or an inert gas such as nitrogen, is filled with a solvent such as pure water or a fluorine based inert liquid, which has a larger refractive index than the refractive index of air. By filling this region with this type of solvent, it is claimed that higher resolutions equivalent to those obtained using a shorter wavelength light source or a larger NA lens can be obtained using the same exposure light source wavelength, with no reduction in the depth of focus range.

Using this type of immersion lithography, resist patterns with higher resolution and a superior depth of focus can be formed at low cost, using lenses mounted in conventional apparatus, and consequently the method is attracting considerable attention.

Non-Patent Reference 1) Journal of Vacuum Science and Technology B (U.S.), 1999, vol. 17, issue 6, pp. 3306-3309.

Non-Patent Reference 2) Journal of Vacuum Science and Technology B (U.S.), 2001, vol. 19, issue 6, pp. 2353-2356.

Non-Patent Reference 3) Proceedings of SPIE (U.S.), 2002, vol. 4691, pp. 459-465.

As described above, an advantage of immersion lithography is that in the production of semiconductor elements, which requires large investments in equipment and facilities, it is expected that large cost benefits and lithographical benefits such as improved resolution should be able to be realized in the semiconductor industry. However, because the resist layer comes in contact with a solvent during exposure as described above, a variety of problems can arise, such as degeneration of the resist layer, or the leaching of components from the resist that have a deleterious effect on the solvent, thus altering the refractive index of the solvent and impairing the inherent advantages offered by the immersion lithography process. Accordingly, it remains unclear whether or not immersion lithography is capable of forming a resist pattern of equivalent quality to those produced by conventional exposure processes. When an attempt was made to apply conventional KrF resists and ArF resist compositions to immersion lithography, a variety of problems emerged due to the effects of the solvent, including deterioration in the sensitivity, roughening of the surface of the resist pattern (a deterioration in the profile shape) such as the formation of T-top shaped resist patterns, or swelling of the resist pattern.

SUMMARY OF THE INVENTION

The present invention takes the problems associated with the conventional technology into consideration, with an object of providing a positive or negative resist composition for use in a resist pattern formation method that comprises an immersion lithography step, which is resistant to the deleterious effects of the solvent used in the immersion lithography step and displays excellent sensitivity and resist pattern profile, while retaining the advantages offered by the immersion lithography of improved resolution and depth of focus, as well as a method of forming a resist pattern that uses such a resist composition.

As a result of intensive investigations aimed at resolving the above problems, the inventors of the present invention discovered that they were able to resolve the problems with the devices described below, and were hence able to complete the present invention.

In other words, a first aspect of the present invention is a resist composition used in a resist pattern formation method that comprises an immersion exposure step, wherein when a film formed using the resist composition is immersed in water, either following exposure or in an unexposed state, and the variation in the thickness of the film is measured by a quartz oscillator method while in a state of immersion, the maximum increase in the film thickness within 10 seconds of commencing measurement of the film is no more than 1.0 nm for both the exposed film and the unexposed film.

Furthermore, a second aspect of the present invention is a positive resist composition used in a resist pattern formation method that comprises an immersion exposure step, wherein if the sensitivity when a 1:1 line and space resist pattern of 130 nm is formed by a normal exposure lithography process using a light source with a wavelength of 193 nm is termed X1, and the sensitivity when an identical 1:1 line and space resist pattern of 130 nm is formed by a simulated immersion lithography process in which a step for bringing a solvent for the above immersion lithography in contact with the resist film is inserted between the selective exposure step and the post exposure baking (PEB) step of a normal exposure lithography process using a light source with a wavelength of 193 nm is termed X2, then the absolute value of $[(X2/X1)-1] \times 100$ is no more than 8.0.

Furthermore, a third aspect of the present invention is a negative resist composition used in a resist pattern formation method that comprises an immersion exposure step, wherein if the sensitivity when a 1:1 line and space resist pattern of 160 nm is formed by a normal exposure lithography process using a light source with a wavelength of 193 nm is termed X1', and the sensitivity when an identical 1:1 line and space resist pattern of 160 nm is formed by a simulated immersion lithography process in which a step for bringing a solvent for the above immersion lithography in contact with the resist film is inserted between the selective exposure step and the post exposure baking (PEB) step of a normal exposure lithography process using a light source with a wavelength of 193 nm is termed X2', then the absolute value of $[(X2'/X1')-1] \times 100$ is no more than 8.0.

Furthermore, a fourth aspect of the present invention is a positive resist composition used in a resist pattern formation method that comprises an immersion exposure step, comprising a resin component (A) which contains an acid dissociable, dissolution inhibiting group and displays increased alkali solubility under the action of acid, an acid generator component (B) that generates acid on exposure, and an organic solvent (C) capable of dissolving the component (A) and the component (B), wherein the component (A) contains a structural unit (a1) derived from a (meth)acrylate ester containing an acid dissociable, dissolution inhibiting group, but contains no structural units (a0), including structural units (a0-1) containing an anhydride of a dicarboxylic acid, and structural units (a0-2) containing a phenolic hydroxyl group.

Furthermore, a fifth aspect of the present invention is a method of forming a resist pattern using a resist composition according to any one of the first through fourth aspects described above, which comprises an immersion exposure step.

In developing the present invention, the inventors of the present invention used the processes described below to analyze methods for evaluating the suitability of resist films for use within a resist pattern formation method that comprises an immersion exposure step, and then evaluated the resist composition and the resist pattern formation method using that resist composition based on the results of these analyses.

In other words, in order to evaluate the performance of resist pattern formation using immersion exposure, it was determined that three factors needed to be considered: namely (i) the performance of the optical system using immersion lithography, (ii) the effect of the resist film on the immersion solvent, and (iii) degeneration of the resist film caused by the immersion solvent.

(i) In terms of the performance of the optical system, if one considers the case in which a surface water resistant photosensitive plate for photography is immersed in water and the surface of this plate is then irradiated with patterned light, then theoretically there is no doubt that provided no light transmission loss such as reflection or the like occurs at the water surface and the interface between the water and the photosensitive plate, then no subsequent problems should arise. Light transmission loss in this situation can be easily resolved by optimization of the angle of incidence of the exposure light. Accordingly, regardless of whether the object being irradiated is a resist film, a photographic photosensitive plate, or an imaging screen, provided the object is inactive with respect to the immersion solvent, that is, provided the object being irradiated is neither affected by the solvent, nor causes any effect on the solvent, then it is considered that there will be no change in the performance of the optical system. Accordingly, this factor requires no new test.

(ii) The effect of the resist film on the immersion solvent refers specifically to the leaching of components out of the resist film and into the solvent, thereby altering the refractive index of the immersion solvent. If the refractive index of the immersion solvent changes, then it is absolutely clear from theory, even without performing a test, that the optical resolution of the patterned exposure light will also change. This factor can be adequately identified by confirming either a change in the composition of the immersion solvent or a change in the solvent refractive index as a result of leaching of a resist component upon immersion of the resist film into the immersion solvent, and there is no need to actually irradiate patterned light onto the resist, and then develop the resist and determine the resolution.

In contrast, if patterned light is irradiated onto the resist film in the immersion solvent, and the resist is then developed and the resolution is determined, then even if a change in the resolution is determined, there is no way of distinguishing whether the change is a result of a degeneration in the immersion solvent affecting the resolution, a degeneration in the resist film affecting the resolution, or a combination of both factors.

(iii) In terms of analyzing resolution deterioration resulting from a degeneration of the resist film caused by the immersion solvent, a simple evaluation test can be conducted in which "a process for bringing an immersion solvent, in the form of a shower for example, in contact with the resist film is conducted between selective exposure of the resist and post exposure baking (PEB), and the resist film is subsequently developed, and the resolution of the resulting resist pattern is inspected". Moreover, in this evaluation test, sprinkling the immersion solvent directly onto the resist film makes the immersion conditions more stringent. If the exposure is conducted with the resist film in a state of complete immersion, then it is impossible to determine whether any change in resolution is an effect of a degeneration in the immersion solvent, a result of a degeneration in the resist composition caused by the immersion solvent, or a combination of both factors.

The fenomena described in (ii) and (iii) above, are two side of the same coin, and can be grasped by ascertaining the deterioration in the pattern shape of the resist film caused by the immersion solvent, and the deterioration in sensitivity. Accordingly, verifying only the factor (iii) described above, incorporates a verification of the factor (ii).

Based on these analyses, it was discovered that the suitability of a resist film formed from a new resist composition for use within an immersion lithography process could be confirmed by an evaluation test in which "a process for bringing an immersion solvent, in the form of a shower for example, in contact with the resist film is conducted between selective exposure of the resist and post exposure baking (PEB), and the resist film is subsequently developed, and the resolution of the resulting resist pattern is inspected" (hereafter referred to as "evaluation test 1").

In addition, confirmation was also made using another evaluation method that represents a further evolution of the evaluation test 1, wherein an evaluation test that represents a simulation of the actual production process is conducted in which "the patterned exposure light is substituted with interference light from a prism, and the sample is placed in an actual state of immersion and exposed (a double beam interference exposure method)" (hereafter referred to as "evaluation test 2").

Furthermore, the relationship between the resist film and the immersion solvent can be ascertained by an "evaluation test 3", using a quartz oscillator method (a film thickness measurement method using a quartz crystal microbalance), which provides a method of measuring microscopic variations in film thickness.

In the present invention, the term "normal exposure" refers to conventionally conducted exposure in which the region between the exposure apparatus lens and the resist layer disposed on top of the wafer is filled with air or an inert gas such as nitrogen. The term "(meth)acrylic acid" refers to either one of, or both methacrylic acid and acrylic acid. The term "structural unit" refers to a monomer unit that contributes to the formation of a polymer. The term "lactone unit" refers to a group in which one hydrogen atom has been removed from a monocyclic or polycyclic lactone. A "lithography process" typically comprises sequential steps for resist application, prebaking, selective exposure, post exposure baking and alkali developing, although in some cases a post bake step may also be provided following the alkali developing.

According to the present invention, a high precision resist pattern which displays no surface roughening of the resist pattern such as the formation of T-top shaped patterns, and displays minimal deterioration in sensitivity, little swelling, and an excellent resist pattern profile can be produced using immersion lithography. Accordingly, by using a resist composition of the present invention, resist pattern formation that comprises an immersion lithography step can be carried out effectively.

BRIEF DESCRIPTION OF THE DRAWINGS

FIG. 9 is a graph showing the results of a reference example 1.
FIG. 10 is a graph showing the results of a reference example 2.

DETAILED DESCRIPTION OF THE INVENTION

Figure 1:
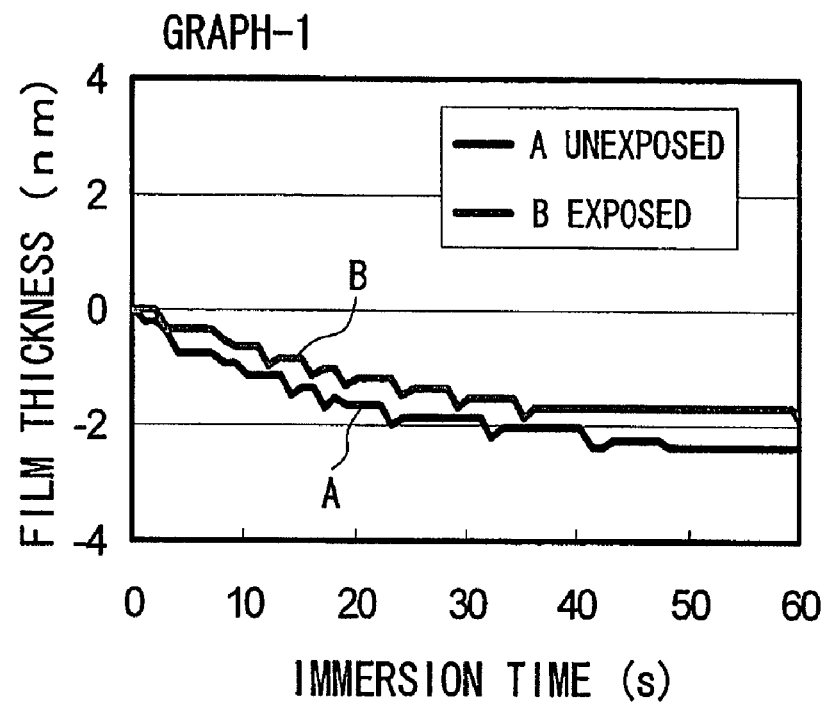
FIG. 1 is a graph showing the results of an example 14.

As follows is a more detailed description of the present invention.

[Resist Composition of the First Aspect of the Present Invention]

As described above, a first aspect of the present invention is a resist composition used in a resist pattern formation method that comprises an immersion exposure step, wherein when a film formed using the resist composition is immersed in water, either following exposure or in an unexposed state, and the variation in the thickness of the film is measured by a quartz oscillator method while in a state of immersion, the maximum increase in the film thickness within 10 seconds of commencing measurement of the film is no more than 1.0 nm for both the exposed film and the unexposed film.

As is very evident from the examples, the comparative examples and the graphs described below, a resist composition in which the aforementioned maximum increase in the film thickness is no more than 1.0 nm is extremely suitable as a resist composition for use in an immersion lithography process, is very resistant to the effects of the solvent used in the immersion lithography process, and displays excellent sensitivity and resist pattern profile. The maximum increase in the film thickness is preferably no more than 0.8 nm, and even more preferably no more than 0.5 nm, and the closer the increase is to 0, the more suitable the composition is for immersion lithography.

Specifics of the first aspect are described below, in accordance with the procedure used for measuring the value of the film thickness.

A "film formed using the resist composition" refers to a film formed by using a rotary application method to apply a predetermined thickness of a resist composition to the gold deposition surface of a quartz crystal substrate that has been subjected to gold vapor deposition, and subsequently drying the applied composition. Here, "drying" refers to heating used to volatilize the solvent from within the resist composition, and is the same as the prebake step in a lithography process. There are no particular restrictions on the predetermined thickness described above, although in (the examples of) the present invention, the thickness was evaluated as 150 nm.

The specific conditions associated with the method of measuring variations in the film thickness using a quartz oscillator method are described below. Gold is deposited onto one surface of a 1-inch diameter quartz substrate using vacuum deposition, the substrate is positioned with this gold deposited surface facing upwards and is rotated at a rate of 1500 rpm to 2500 rpm, or more specifically at approximately 2000 rpm, and a spinner is then used to apply a sufficient quantity of the resist composition to the gold deposited surface to generate a dried film 150 nm thick. Two of the thus-obtained films are then dried for 90 seconds at 115° C., the resist films are peeled off so that the substrate electrode and the socket electrode come into contact, and one of the films is then exposed to an ArF excimer laser (193 nm) (exposure apparatus NSR-S302, manufactured by Nikon Corporation, NA (numerical aperture)=0.60, 2/3 annular illumination) and the other film is left unexposed, and they are subsequently immersed in pure water at 23° C., and in this state of immersion, the variations in the thicknesses of the films are measured by a quartz oscillator method at an oscillating frequency of 5 MHz (megahertz).

One of the films is exposed and the other film is left unexposed, and they are immersed in water. This is to determine the variation in film thickness caused by the effect of water on exposed sections and unexposed sections. The most suitable light source for that particular resist is used, and therefore a KrF excimer laser (248 nm) is used for a KrF resist, an ArF excimer laser (193 nm) is used for an ArF resist, and a $F_2$ excimer laser (157 nm) is used for a $F_2$ resist. There are no particular restrictions on the exposure dose used during exposure, although as one indicator, a large, visibly detectable area can be exposed and developed in a lithography process, and the minimum dose required to enable the developing step to remove the resist film from the large area, thus exposing the substrate, can be used.

Subsequently, a substrate on which is provided a film with exposed sections, and a substrate on which is provided a film with unexposed sections are each immersed in water, and the variation in the thickness of the films is measured by a quartz oscillator method with the substrates in a state of immersion. A quartz oscillator method is a method of measuring film thickness that uses a conventional quartz crystal microbalance. This method enables very fine variations in the film thickness, on the order of nanometers, to be measured for the exposed sections and unexposed sections of the resist pattern that are immersed in water. In the present invention, the measurement device used was a RDA-QZ3 device manufactured by Lintec Japan Corporation.

Figure 6:
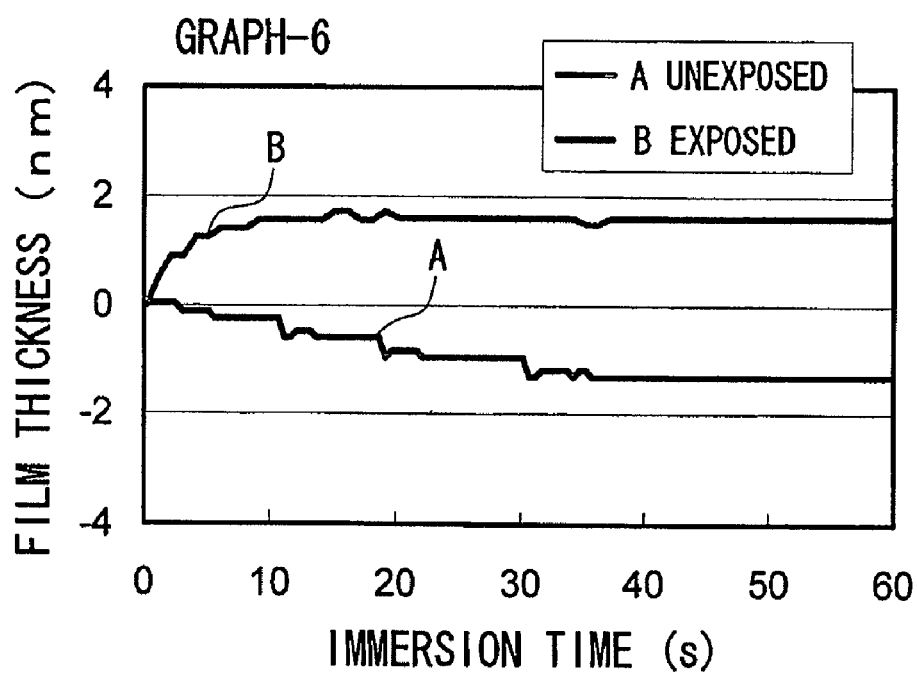
FIG. 6 is a graph showing the results of a comparative example 7.
Figure 7:
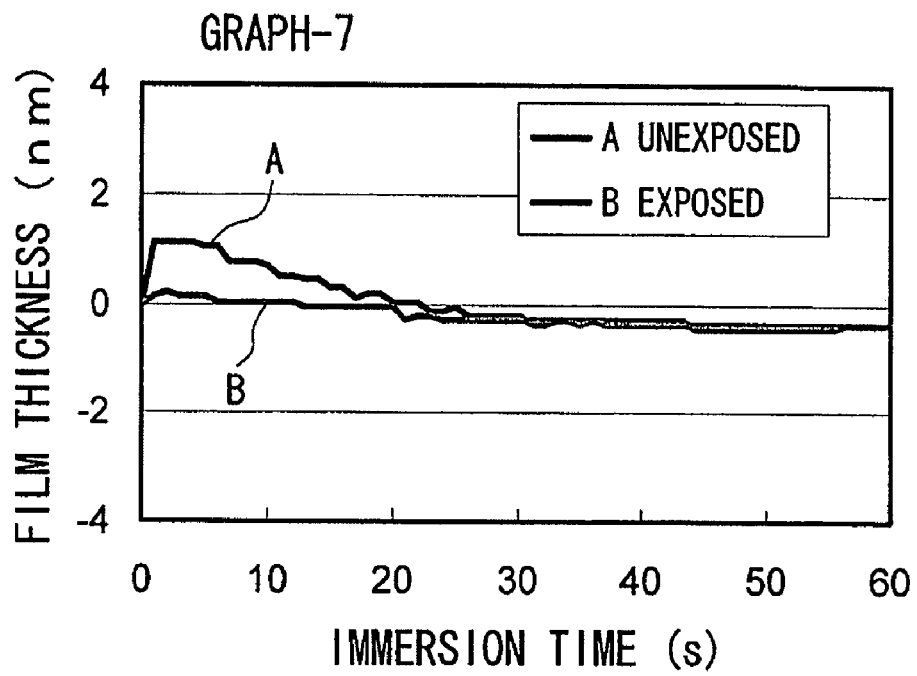
FIG. 7 is a graph showing the results of a comparative example 8.
Figure 8:
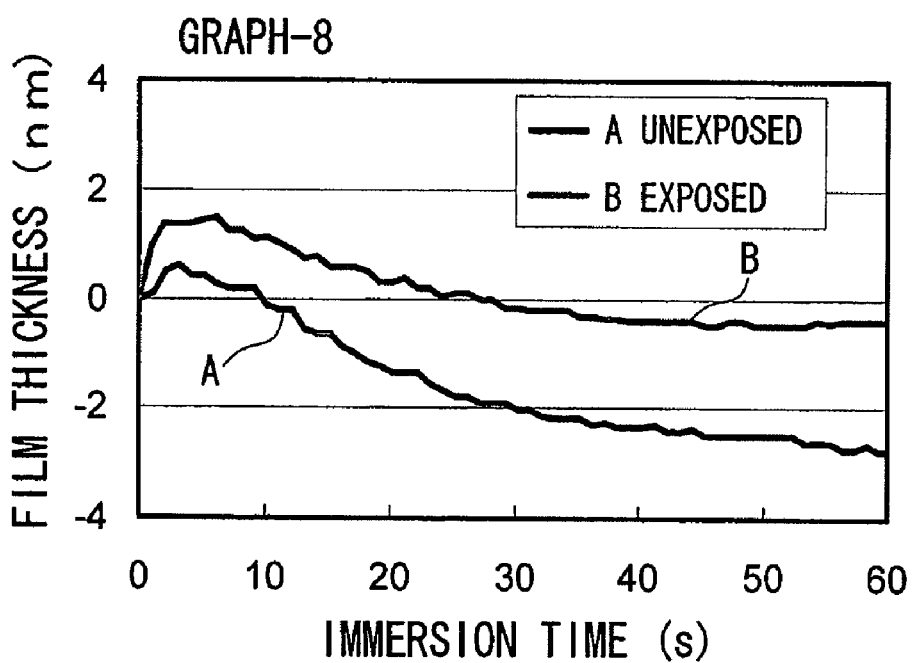
FIG. 8 is a graph showing the results of a comparative example 9.

As is evident from the comparative examples described below and the graphs showing the results of these comparative examples (FIG. 6 to FIG. 8), in resists that are inappropriate as resist compositions for use in immersion lithography processes, at least one of the exposed film or the unexposed film, that is, either one or both of the films, displays a maximum increase in the film thickness within 10 seconds of commencing measurement that exceeds 1.0 nm.

In contrast, in the case of a resist according to the first aspect, in which the maximum increase in the film thickness within 10 seconds of commencing measurement is no more than 1.0 nm for both of the above films, ultra fine resist patterns with patterns as small as 45 nm were able to be formed.

The reason that 10 seconds from the commencement of measurement was chosen as the time frame is that the time required for an actual immersion lithography process is very short, and consequently a satisfactory judgment can be made based on the behavior within that 10 second period. In actual fact, if a judgment is made over a longer time period, then the judgment becomes further removed from an actual immersion process, making the measured value meaningless.

A maximum increase in the film thickness of no more than 1.0 nm can be easily comprehended by drawing a graph with the immersion time along the horizontal axis and the variation in film thickness along the vertical axis for both the exposed film and the unexposed film. Based on this graph, the maximum increase in the film thickness is determined from the curve representing each of the films, and this value must be no more than 1.0 nm.

Furthermore, the increase in the film thickness is determined from a curve positioned above the 0 reference point of the graph, whereas the decrease in the film thickness is determined from a curve positioned below the 0 point.

From this type of graph, the increase or decrease in the film thickness of the exposed film and the unexposed film is preferably small, and substantially horizontal with respect to the time axis, so that even after 20 seconds, and preferably even after 60 seconds, the increase or decrease in the film thickness of the exposed film and the unexposed film is preferably no more than 2 nm.

As is evident from the results of the example 17 and the example 18, resist compositions that use either a ternary polymer containing (meth)acrylate units of a norbornane lactone, or a quaternary polymer containing (meth)acrylate units of a γ-butyrolactone are particularly preferred.

[Positive Resist Composition of the Second Aspect and Negative Resist Composition of the Third Aspect of the Present Invention]

As described above, a second aspect of the present invention is a positive resist composition used in a resist pattern formation method that comprises an immersion exposure step, wherein if the sensitivity when a 1:1 line and space resist pattern of 130 nm is formed by a normal exposure lithography process using a light source with a wavelength of 193 nm is termed X1, and the sensitivity when an identical 1:1 line and space resist pattern of 130 nm is formed by a simulated immersion lithography process in which a step for bringing a solvent for the above immersion lithography in contact with the resist film is inserted between the selective exposure step and the post exposure baking (PEB) step of a normal exposure lithography process using a light source with a wavelength of 193 nm is termed X2, then the absolute value of $[(X2/X1)-1] \times 100$ is no more than 8.0.

Furthermore, a third aspect of the present invention is a negative resist composition used in a resist pattern formation method that comprises an immersion exposure step, wherein if the sensitivity when a 1:1 line and space resist pattern of 160 nm is formed by a normal exposure lithography process using a light source with a wavelength of 193 nm is termed X1', and the sensitivity when an identical 1:1 line and space resist pattern of 160 nm is formed by a simulated immersion lithography process in which a step for bringing a solvent for the above immersion lithography in contact with the resist film is inserted between the selective exposure step and the post exposure baking (PEB) step of a normal exposure lithography process using a light source with a wavelength of 193 nm is termed X2', then the absolute value of $[(X2'/X1')-1] \times 100$ is no more than 8.0. The absolute values defined above are typically no more than 8.0 for both positive and negative resist compositions, and are preferably no more than 5.0, and even more preferably no more than 3, and are most preferably as close to 0 as possible.

As described above, from the results of the evaluation test 1, the evaluation test 2 and the evaluation test 3, the inventors of the present invention discovered that a resist composition that satisfies the maximum increase in film thickness defined in the first aspect, and the absolute values defined in the second and third aspects respectively, is extremely suitable as a resist composition for immersion lithography processes, is very resistant to the effects of the solvent used in the immersion lithography process, and displays excellent sensitivity and resist pattern profile.

The normal exposure lithography process using a light source with a wavelength of 193 nm described in the second and third aspects refers to a normal lithography process, namely, sequential steps for resist application, prebaking, selective exposure, post exposure baking and alkali developing, which is conducted using an ArF excimer laser with a wavelength of 193 nm as the light source, by performing a normal exposure with the region between the exposure apparatus lens and the resist layer disposed on top of the wafer filled with air or an inert gas such as nitrogen. In some cases, a post bake step may also be provided following the alkali developing, and an organic or inorganic anti-reflective film may also be provided between the substrate and the applied layer of the resist composition.

The sensitivity X1 when a 130 nm 1:1 line and space resist pattern (hereafter abbreviated as "130 nm L&S") is formed by this type of normal exposure lithography process is the exposure dose for forming a 130 nm L&S, which is widely used in the industry and is self-explanatory.

To describe this sensitivity briefly for the sake of thoroughness, the exposure dose is placed along the horizontal axis, the resist line width formed using that exposure dose is placed on the vertical axis, and a logarithmic approximation curve is obtained from the plot using the method of least squares.

The formula is represented by $Y = a\mathrm{Log}_e(X1) + b$, wherein X1 represents the exposure dose, Y represents the resist line width, and a and b are constants. If this formula is rearranged and converted to a formula representing X1, the formula X1

=Exp[(Y−b)/a] is obtained. If the value Y=130 (nm) is introduced into this formula, then the calculated ideal sensitivity X1 can be determined.

The conditions during this process, namely the rotational speed during application of the resist, the prebake temperature, the exposure conditions, the post exposure baking conditions, and the alkali developing conditions can all be set to conventionally used conditions, and are self-evident for forming a 130 nm L&S. Specifically, a silicon wafer with a diameter of 8 inches is used as the substrate, the rotational speed is set to approximately 1000 to 4000 rpm, or more specifically to approximately 2000 rpm, and the prebake temperature is set within a range from 70 to 140° C. (setting the temperature to a level that enables a 1:1 ratio for a 130 nm line and space pattern is self-evident to participants in the industry, and the temperature can be set as desired within the above range), and this enables a 6 inch diameter resist film with a film thickness of 80 to 250 nm, or more specifically of 150 nm, to be formed concentrically on top of the substrate.

The exposure conditions involve exposure through a mask, using an ArF excimer laser exposure apparatus with a wavelength of 193 nm manufactured by Nikon Corporation or Canon Inc. or the like, or more specifically the exposure apparatus NSR-S302 (manufactured by Nikon Corporation, NA (numerical aperture)=0.60, 2/3 annular illumination). A normal binary mask is used as the mask in the selective exposure. A phase shift mask may also be used for this mask.

The post exposure baking uses a temperature within a range from 90 to 140° C. (setting the temperature to a level that enables a 1:1 ratio for a 130 nm line and space pattern is self-evident to participants in the industry, and the temperature can be set as desired within the above range), and the conditions for the alkali developing involve immersing the substrate in a 2.38% by weight developing solution of TMAH (tetramethylammonium hydroxide) at a temperature of 23° C. for a period of 15 to 90 seconds, or more specifically 60 seconds, and then rinsing the substrate with water.

In addition, the simulated immersion lithography process described in the second aspect refers to a process in which a step for bringing an immersion exposure solvent in contact with the resist film is inserted between the selective exposure step and the post exposure baking (PEB) step of a normal exposure lithography process which uses the same 193 nm ArF excimer laser described above as the light source.

Specifically, the simulated process involves sequential steps for resist application, prebaking, selective exposure, a step for bringing the immersion exposure solvent in contact with the resist film, post exposure baking and alkali developing. In some cases, a post bake step may also be provided following the alkali developing.

The conditions for the contact described above are as follows. Pure water is dripped onto the center of the substrate from a rinse nozzle, while the wafer and the attached exposed resist film is rotated; rotational speed of the substrate on which the resist is formed: 500 rpm; solvent: pure water; rate of dropwise addition of the solvent: 1.0 L/min; solvent dripping time: 2 minutes or 5 minutes; solvent and resist contact temperature: 23° C.

The sensitivity X2 when a 130 nm L&S resist pattern is formed using this type of simulated immersion lithography process is similar to the value of X1 described above in that it represents the exposure dose for forming the 130 nm L&S, which is a widely used value in the industry.

The conditions during this process (the rotational speed during application of the resist, the prebake temperature, the exposure conditions, the post exposure baking conditions, and the alkali developing conditions) are also similar to the case of X1 described above.

In the second aspect, the absolute value of $[(X2/X1)-1] \times 100$ must be no more than 8.0, and this absolute value is self-evident if the values of X2 and X1 are determined in the manner described above. Similarly, the values for X1' and X2' in the third aspect differ only in that the resist pattern line width is altered to 160 nm, and are otherwise identical with X1 and X2. Naturally, $[(X2'/X1')-1] \times 100$ is also identical.

If the absolute value exceeds 8.0, then the resist composition becomes unsuitable for use in an immersion lithography process, and problems arise such as the resist pattern developing a T-top shape, or collapse of the resist pattern.

In the case of evaluation using a KrF excimer laser with a wavelength of 248 nm, then as described below, with the exceptions of altering the exposure wavelength and the line and space pattern size, the same effects as the second aspect of the present invention can be achieved by ensuring that the same absolute value is no more than 8.0.

In other words, in the case of a KrF excimer laser, the present invention provides a positive resist composition used in a resist pattern formation method that comprises an immersion exposure step, wherein if the sensitivity when a 1:1 line and space resist pattern of 150 nm is formed by a normal exposure lithography process using a light source with a wavelength of 248 nm is termed X1, and the sensitivity when an identical 1:1 line and space resist pattern of 150 nm is formed by a simulated immersion lithography process in which a step for bringing a solvent for the above immersion lithography in contact with the resist film is inserted between the selective exposure step and the post exposure baking (PEB) step of a normal exposure lithography process using a light source with a wavelength of 248 nm is termed X2, then the absolute value of $[(X2/X1)-1] \times 100$ is no more than 8.0. This absolute value is preferably no more than 5, and even more preferably no more than 3, and most preferably as close to 0 as possible.

The steps for resist application, prebaking, selective exposure, post exposure baking and alkali developing, which are conducted sequentially in the lithography process, are identical with those described for the second aspect, with the exceptions of altering the resist film thickness during formation of the line and space pattern to a value within a range from 300 to 400 nm, and altering the exposure light to KrF light.

There are no particular restrictions on the resist composition of the first aspect of the present invention, the positive resist composition of the second aspect of the present invention, or the negative resist composition of the third aspect of the present invention, although chemically amplified resist compositions comprising a resin component that undergoes a change in alkali solubility under the action of acid, and an acid generator component that generates acid on exposure are preferred. Many of these chemically amplified resists have been proposed for use with KrF, ArF, $F_2$, electron beam and X-ray exposure, and there are no particular restrictions on the resist provided the specified range for the above absolute value is satisfied.

As the aforementioned resin component, one or more alkali soluble resins, or resins that can be converted to an alkali soluble state, which are typically used as the base resin for chemically amplified resists, can be used. The former describes a so-called negative resist composition, and the latter describes a positive resist composition.

In the case of a negative composition, a cross linking agent is added with the acid generator component. Then, during resist pattern formation, when acid is generated from the acid generator by exposure, the action of this acid causes cross linking between the alkali soluble resin component and the cross linking agent, making the composition alkali insoluble. As the alkali soluble resin, resins comprising units derived from at least one compound selected from a group consisting of α-(hydroxyalkyl)acrylic acids and lower alkyl esters of α-(hydroxyalkyl)acrylic acids are capable of forming a favorable resist pattern with little swelling in an immersion lithography process, and are consequently preferred.

Furthermore, as the cross linking agent, using an amino based cross linking agent which is essentially insoluble in the immersion exposure solvent, such as a glycoluril comprising a methylol group or an alkoxymethyl group, and in particular a butoxymethyl group, enables the formation of a favorable resist pattern with little swelling in an immersion lithography process, and is consequently preferred. The quantity added of the cross linking agent is preferably within a range from 1 to 50 parts by weight per 100 parts by weight of the alkali soluble resin.

In the case of a positive composition, the resin component is an alkali insoluble compound with a so-called acid dissociable, dissolution inhibiting group, and when acid is generated from the acid generator component by exposure, this acid causes the acid dissociable, dissolution inhibiting group to dissociate, making the resin component alkali soluble.

Regardless of whether the composition is positive or negative, the resin component preferably does not contain any structural units (a0) detailed below in the positive resist composition of the fourth aspect of the present invention, including structural units (a0-1) containing an anhydride of a dicarboxylic acid, and structural units (a0-2) containing a phenolic hydroxyl group (hereafter referred to as either (a0) or (a0) units). By excluding these structural units, the maximum increase in film thickness described in the first aspect can be maintained at no more than 1.0 nm, and the absolute value described in the second and third aspects can be adjusted to a value of no more than 8.0.

[Positive Resist Composition]

A positive resist composition according to the fourth aspect of the present invention is a positive resist composition used in a resist pattern formation method that comprises an immersion exposure step, and comprises a resin component (A) which contains an acid dissociable, dissolution inhibiting group and displays increased alkali solubility under the action of acid, an acid generator component (B) that generates acid on exposure, and an organic solvent (C) capable of dissolving the component (A) and the component (B), wherein the component (A) contains a structural unit (a1) derived from a (meth)acrylate ester containing an acid dissociable, dissolution inhibiting group, but contains no structural units (a0) including structural units (a0-1) containing an anhydride of a dicarboxylic acid, and structural units (a0-2) containing a phenolic hydroxyl group.

In this type of positive resist composition, when acid generated from the component (B) acts on the resin, the acid dissociable, dissolution inhibiting group contained within the component (A) dissociates, converting the entire component (A) from an alkali insoluble state to an alkali soluble state.

Accordingly, during resist pattern formation, by selectively irradiating the positive resist composition applied to the substrate through a mask pattern, the alkali solubility of the exposed sections improves, enabling alkali developing to be conducted.

[Resin Component (A)]

In a positive resist composition according to the fourth aspect, the component (A) must not contain any structural units (a0), including structural units (a0-1) containing an anhydride of a dicarboxylic acid, and structural units (a0-2) containing a phenolic hydroxyl group (hereafter referred to as either (a0) or (a0) units).

In this description, a structural unit (a0-1) containing an anhydride of a dicarboxylic acid refers to a structural unit with a —C(O)—O—C(O)— structure. Examples of this type of unit include structural units containing either a monocyclic or polycyclic cyclic anhydride, and specific examples include units derived from the monocyclic and polycyclic maleic anhydrides shown below in [formula 1], and units derived from the itaconic anhydride shown below in [formula 2].

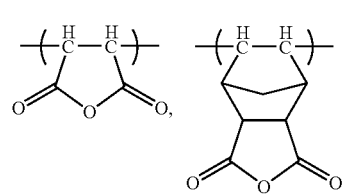

[FORMULA 1]

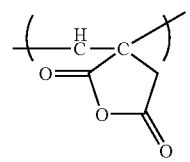

[FORMULA 2]

Furthermore, a structural unit (a0-2) containing a phenolic hydroxyl group refers to a structural unit containing at least one hydroxyl group bonded to an aromatic hydrocarbon ring such as a benzene or naphthalene ring. Examples of this type of unit include hydroxystyrene units and (α-methyl)hydroxystyrene units.

By ensuring that the component (A) does not contain (a0) units, namely (a0-1) and (a0-2) units, a positive resist composition according to the fourth aspect is able to form a resist pattern with excellent sensitivity and profile, even in an immersion exposure (immersion lithography) process.

Resist compositions that contain the above type of (a0) units suffer problems such as degeneration of the resist layer in immersion lithography processes, and it is believed that these problems lead to deterioration in the sensitivity and the profile of the resist pattern.

In a positive resist composition according to the fourth aspect, there are no particular restrictions on the component (A), provided it contains no (a0) units and contains a structural unit derived from a (meth)acrylate ester containing an acid dissociable, dissolution inhibiting group (hereafter referred to as either (a1) or an (a1) unit), as described above.

In terms of improving the resolution and achieving characteristics that are most suited to applications in which exposure is conducted using an ArF excimer laser, the component (A) preferably incorporates at least 80 mol %, and even more preferably at least 90 mol % (and most preferably 100 mol %) of structural units derived from (meth)acrylate esters.

Furthermore, in order to ensure satisfactory resolution, dry etching resistance and an ultra fine pattern shape, the component (A) preferably comprises a plurality of monomer units with different functions in addition to the (a1) units, such as a combination of the structural units described below.

Structural units derived from a (meth)acrylate ester containing a lactone unit (hereafter referred to as either (a2) or (a2) units).

Structural units derived from a (meth)acrylate ester containing a polycyclic group with an alcoholic hydroxyl group (hereafter referred to as either (a3) or (a3) units).

Structural units containing a polycyclic group which differs from the acid dissociable, dissolution inhibiting group of the (a1) units, the lactone unit of the (a2) units and the polycyclic group with an alcoholic hydroxyl group of the (a3) units (hereafter referred to as either (a4) or (a4) units).

The (a2), (a3) and/or (a4) units can be combined appropriately to achieve the desired characteristics.

The component (A) preferably comprises (a1) and (a2) units, as this improves the resistance to dissolution in the solvent used in the immersion lithography process, and produces a favorable resolution and resist pattern shape. Furthermore, these two structural units preferably account for at least 40 mol %, and even more preferably at least 60 mol % of the component (A).

Each of the units (a1) to (a4) may also be combined with a plurality of different units.

In the structural units derived from (meth)acrylate esters such as the units (a1) to (a4) that are incorporated within the component (A), employing a combination which contains both structural units derived from a methacrylate ester and structural units derived from an acrylate ester is preferred, as it enables production of a positive resist composition which displays little surface roughness on etching, minimal line edge roughness, excellent resolution and a broad depth of focus range.

The term "surface roughness on etching" is different from the aforementioned resist pattern surface roughness (deterioration in the profile) caused by the effects of the solvent, or conventional dry etching resistance, and appears on etched resist patterns following developing and formation of the resist pattern, either as distortions around the hole patterns in a contact hole pattern or as line edge roughness in a line and space pattern.

Line edge roughness occurs in resist patterns following developing. Line edge roughness appears as distortions around the hole patterns in a hole resist pattern or as non-uniform irregularities in the side surfaces in a line and space pattern.

Furthermore as described above, leading edge technology continues to demand ever finer resolutions, in the vicinity of 90 nm, the vicinity of 65 nm, the vicinity of 45 nm, and even narrower resolutions, and it is envisaged that immersion lithography will be able to provide these types of resolution improvements.

In addition, broadening the depth of focus range characteristics is also desirable.

In the component (A), by incorporating both structural units derived from a methacrylate ester and structural units derived from an acrylate ester, the aforementioned types of characteristics can be improved.

Furthermore, by incorporating the two types of structural units, a defect reduction effect can also be achieved. In this description, the term defect refers to general problems such as scum and resist pattern problems detected by inspecting the developed resist pattern from directly overhead using a surface defect inspection apparatus manufactured by KLA Tencor Corporation (brand name "KLA").

In this case, there are no particular restrictions on the form of the component (A) provided it incorporates structural units derived from a methacrylate ester and structural units derived from an acrylate ester, and suitable forms for the component (A) include: a copolymer (A1) in which the composition comprises a copolymer containing structural units derived from a methacrylate ester and structural units derived from an acrylate ester; and a mixed resin (A2) in which the composition comprises a mixed resin of a polymer containing at least structural units derived from a methacrylate ester, and a polymer containing at least structural units derived from an acrylate ester. Either one, or both of the polymers which constitute this mixed resin (A2) may be an aforementioned copolymer (A1).

The component (A) may also contain other resin components, although components formed from an aforementioned copolymer (A1) and/or a mixed resin (A2) are preferred.

The copolymer (A1) and the mixed resin (A2) may each also utilize combinations of two or more different materials.

The relative quantities of the structural units derived from a methacrylate ester and structural units derived from an acrylate ester within the component (A) are preferably adjusted so that relative to the total number of mols of structural units derived from methacrylate esters and acrylate esters, the structural units derived from a methacrylate ester account for 10 to 85 mol %, and preferably from 20 to 80 mol %, and the structural units derived from an acrylate ester account for 5 to 90 mol %, and preferably from 20 to 80 mol %.

If the quantity of structural units derived from a methacrylate ester is too high then the surface roughness improvement effect diminishes, whereas if the quantity of structural units derived from an acrylate ester is too high then there is a danger of a decrease in resolution.

As follows is a more detailed description of the units (a1) to (a4) mentioned above.

[(a1) Units]

An (a1) unit is a structural unit derived from a (meth) acrylate ester containing an acid dissociable, dissolution inhibiting group.

There are no particular restrictions on the acid dissociable, dissolution inhibiting group of the structural unit (a1), provided it displays an alkali dissolution inhibiting effect that causes the entire component (A) to be alkali insoluble prior to exposure, but dissociates under the action of acid generated from the aforementioned component (B) following exposure, causing the entire component (A) to become alkali soluble. Generally, groups which form a cyclic or chain-type tertiary alkyl ester at the carboxyl group of (meth)acrylic acid, tertiary alkoxycarbonyl groups or chain-type alkoxyalkyl groups are the most widely used.

As the acid dissociable, dissolution inhibiting group of (a1), an acid dissociable, dissolution inhibiting group containing an aliphatic polycyclic group is ideal.

Examples of this polycyclic group include groups in which one hydrogen atom has been removed from a bicycloalkane, a tricycloalkane or a tetracycloalkane or the like which is either unsubstituted or substituted with a fluorine atom or a fluorinated alkyl group. Specific examples include groups in which one hydrogen atom has been removed from a polycycloalkane such as adamantane, norbornane, isobornane, tricyclodecane or tetracyclododecane. These types of polycyclic group can be appropriately selected from the multitude of groups proposed for use with ArF resists. Of these groups, adamantyl groups, norbornyl groups and tetracyclododecanyl groups are preferred in terms of industrial availability.

Ideal monomer units for (a1) are shown below in [formula 3] to [formula 11].

[FORMULA 3]

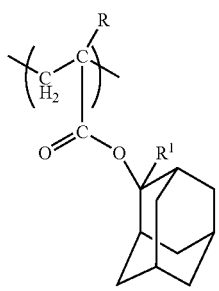

(I)

(wherein R represents a hydrogen atom or a methyl group, and $R^1$ represents a lower alkyl group)

[FORMULA 4]

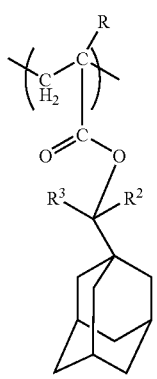

(II)

(wherein, R represents a hydrogen atom or a methyl group, and $R^2$ and $R^3$ each represent, independently, a lower alkyl group)

[FORMULA 5]

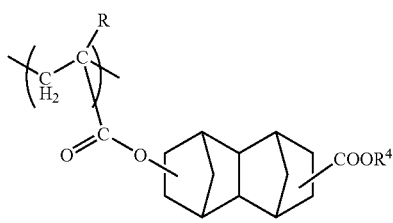

(III)

(wherein, R represents a hydrogen atom or a methyl group, and $R^4$ represents a tertiary alkyl group)

[FORMULA 6]

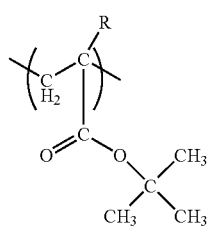

(wherein, R represents a hydrogen atom or a methyl group)

[FORMULA 7]

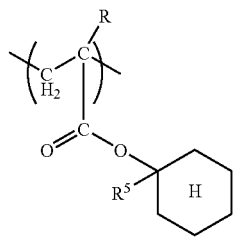

(wherein, R represents a hydrogen atom or a methyl group, and $R^5$ represents a methyl group)

[FORMULA 8]

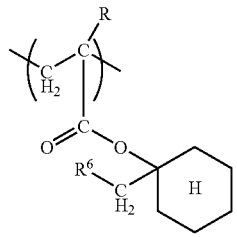

(wherein, R represents a hydrogen atom or a methyl group, and $R^6$ represents a lower alkyl group)

[FORMULA 9]

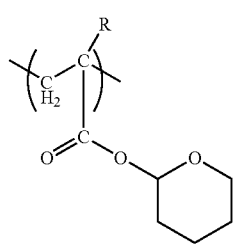

(wherein, R represents a hydrogen atom or a methyl group)

[FORMULA 10]

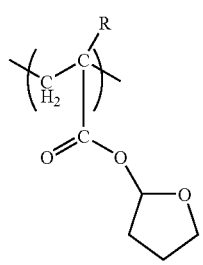

(wherein, R represents a hydrogen atom or a methyl group)

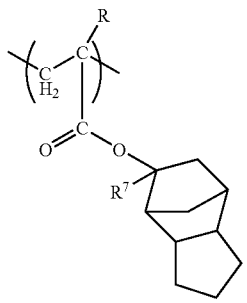

[FORMULA 11]

(wherein, R represents a hydrogen atom or a methyl group, and $R^7$ represents a lower alkyl group)

Within the above formulas, the groups $R^1$ to $R^3$ and $R^6$ to $R^7$ each preferably represent a straight chain or branched alkyl group of 1 to 5 carbon atoms, and specific examples include a methyl group, ethyl group, propyl group, isopropyl group, n-butyl group, isobutyl group, tert-butyl group, pentyl group, isopentyl group and neopentyl group. From the viewpoint of industrial availability, a methyl group or an ethyl group is preferred.

Furthermore, R4 represents a tertiary alkyl group such as a tert-butyl group or a tert-amyl group, although a tert-butyl group is preferred in terms of industrial availability.

As the (a1) unit, of all the units described above, structural units represented by the general formulas (I), (II) and (III) display particularly favorable resistance to dissolution in the solvents used in immersion lithography processes, and are capable of forming patterns with excellent resolution, and are consequently the most preferred.

[(a2) Units]

An (a2) unit contains a lactone unit, and is consequently effective in increasing the adhesion between the resist film and the substrate, and improving the affinity with the developing liquid, and also displays excellent resistance to dissolution in the solvents used in immersion lithography processes.

An (a2) unit of the present invention may be any unit which contains a lactone unit and is copolymerizable with the other structural units of the component (A).

Examples of monocyclic lactone units include groups in which one hydrogen atom has been removed from γ-butyrolactone. Furthermore, examples of polycyclic lactones include groups in which one hydrogen atom has been removed from a polycycloalkane containing a lactone. In the lactone unit, the ring containing the —O—C(O)— structure is counted as the first ring. Accordingly, the case in which the only ring structure is the ring containing the —O—C(O)— structure is referred to as a monocyclic group, and groups containing other ring structures are described as polycyclic groups regardless of the structure of the other rings.

Ideal monomer units for (a2) are shown below in [formula 12] to [formula 14].

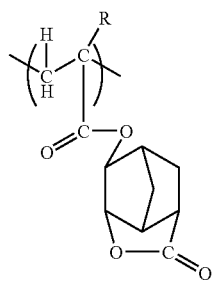

[FORMULA 12]

(wherein, R represents a hydrogen atom or a methyl group)

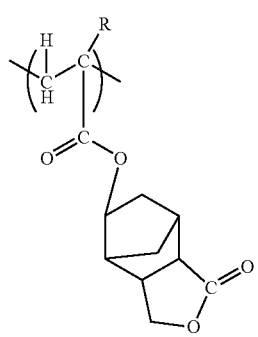

[FORMULA 13]

(wherein, R represents a hydrogen atom or a methyl group)

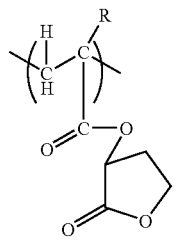

[FORMULA 14]

(wherein, R represents a hydrogen atom or a methyl group)

Of the above structural units, γ-butyrolactone esters of (meth)acrylic acid with an ester linkage at the α-carbon atom such as those shown in [formula 14], or norbornane lactone esters such as those shown in [formula 12] and [formula 13] are particularly preferred in terms of industrial availability.

[(a3) Units]

An (a3) unit is a structural unit derived from a (meth) acrylate ester containing a polycyclic group with an alcoholic hydroxyl group. Because the hydroxyl group of the alcoholic hydroxyl group containing polycyclic group is a polar group, use of the structural unit (a3) results in an increased affinity for the entire component (A) relative to the developing liquid, and an improvement in the alkali solubility of the exposed sections of the resist, while also providing excellent resistance to dissolution in the solvents used in immersion lithography processes. Accordingly, if the component (A) contains (a3) units, then the resolution improves favorably.

As the polycyclic group in the (a3) unit, an aliphatic polycyclic group can be appropriately selected from the various polycyclic groups listed in the above description for the structural unit (a1).

There are no particular restrictions on the alcoholic hydroxyl group containing polycyclic group, and for example, hydroxyl group containing adamantyl groups can be favorably used.

If this hydroxyl group containing adamantyl group is a group represented by a general formula (IV) shown below, then the dry etching resistance improves, as does the verticalness of the pattern cross section, both of which are desirable.

[FORMULA 15]

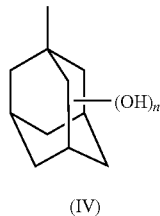

(IV)

(wherein, n represents an integer from 1 to 3)

The (a3) unit may be any unit which contains an aforementioned alcoholic hydroxyl group containing polycyclic group and is copolymerizable with the other structural units of the component (A).

Specifically, structural units represented by a general formula (V) shown below are preferred.

[FORMULA 16]

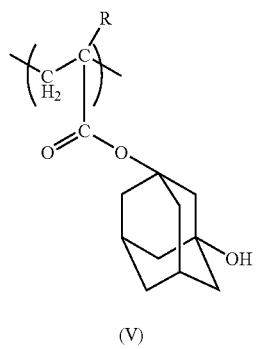

(V)

(wherein, R represents a hydrogen atom or a methyl group)

[(a4) Units]

In a unit (a4), a polycyclic group which "differs from the aforementioned acid dissociable, dissolution inhibiting groups, the aforementioned lactone units and the aforementioned alcoholic hydroxyl group containing polycyclic groups" means that in the component (A), the polycyclic group of the unit (a4) is a polycyclic group which does not duplicate the acid dissociable, dissolution inhibiting group of the (a1) units, the lactone unit of the (a2) units, or the alcoholic hydroxyl group containing polycyclic group of the (a3) units, and also means that the (a4) unit does not hold the acid dissociable, dissolution inhibiting group of the (a1) units, the lactone unit of the (a2) units, or the alcoholic hydroxyl group containing polycyclic group of the (a3) units, which constitute the component (A).

There are no particular restrictions on the polycyclic group of the (a4) unit, provided it is selected so as not to duplicate any of the structural units used in the units (a1) to (a3). For example, as the polycyclic group in the (a4) unit, similar aliphatic polycyclic groups listed in the above description for the structural unit (a1) can be used, and any of the multitude of materials conventionally used for ArF positive resist materials can be used.

From the viewpoint of industrial availability, one or more groups selected from amongst tricyclodecanyl groups, adamantyl groups or tetracyclododecanyl groups is preferred.

The (a4) unit may be any unit which contains an aforementioned polycyclic group and is copolymerizable with the other structural units of the component (A). p Preferred examples of (a4) units are shown below in [formula 17] to [formula 19].

[FORMULA 17]

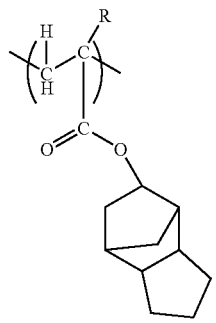

(wherein, R represents a hydrogen atom or a methyl group)

[FORMULA 18]

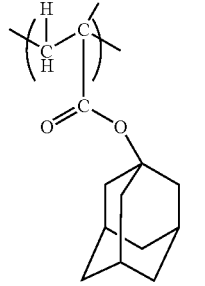

(wherein, R represents a hydrogen atom or a methyl group)

[FORMULA 19]

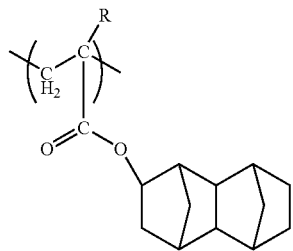

(wherein, R represents a hydrogen atom or a methyl group)

In a positive resist composition according to the fourth aspect of the present invention, component (A) compositions in which the (a1) units account for 20 to 60 mol %, and preferably from 30 to 50 mol %, of the combined total of all the structural units of the component (A) display excellent resolution, and are consequently preferred.

Furthermore, compositions in which the (a2) units account for 20 to 60 mol %, and preferably from 30 to 50 mol %, of the combined total of all the structural units of the component (A) display excellent resolution and adhesion, and are consequently preferred.

Furthermore, in those cases where (a3) units are used, compositions in which the (a3) units account for 5 to 50 mol %, and preferably from 10 to 40 mol %, of the combined total of all the structural units of the component (A) display excellent resist pattern shape, and are consequently preferred.

In those cases where (a4) units are used, compositions in which the (a4) units account for 1 to 30 mol %, and preferably from 5 to 20 mol %, of the combined total of all the structural units of the component (A) offer superior resolution for isolated patterns through to semi-dense patterns, and are consequently preferred.

Of these compositions, positive resist compositions that use either a ternary copolymer in which the respective quantities of each of the structural units (a1) to (a3) in the component (A) are from 20 to 60 mol % for (a1), from 20 to 60 mol % for (a2), and from 5 to 50 mol % for (a3), or a quaternary copolymer in which the respective quantities of each of the structural units (a1) to (a4) in the component (A) are from 25 to 50 mol % for (a1), from 25 to 50 mol % for (a2), from 10 to 30 mol % for (a3), and from 3 to 25 mol % for (a4) enable the formation of a resist pattern with superior sensitivity and profile, even in the case of immersion exposure (immersion lithography), and are consequently preferred.

Furthermore, in the present invention, a resin component of a resist for a $F_2$ excimer laser can also be favorably used, provided it contains the aforementioned (a1) units and contains no (a0) units. This type of $F_2$ resist resin component includes copolymers comprising a unit with a group that contains a fluorine atom or a fluoroalkyl group on the side chain of a (meth)acrylate ester unit.

The resin component (A) in the fourth aspect of the present invention can be produced easily by a conventional radical polymerization of a monomer corresponding with the structural units (a1), and where required monomers corresponding with each of the structural units (a2), (a3) and/or (a4), using a radical polymerization initiator such as azobisisobutyronitrile (AIBN). Furthermore, by also using a chain transfer agent such as $HS-CH_2-CH_2-CH_2-C(CF_3)_2-OH$, a copolymer in which a $-C(CF_3)_2-OH$ group has been introduced at the terminals of the copolymer can also be used.

Furthermore, there are no particular restrictions on the weight average molecular weight (the polystyrene equivalent value, this also applies to subsequently molecular weight values) of the component (A) in any of the first through fourth aspects of the present invention, although values are typically within a range from 2,000 to 30,000, and in the case of a negative composition are from 2,000 to 20,000, and preferably from 4,000 to 15,000, and in the case of a positive composition are from 5,000 to 30,000, and preferably from 8,000 to 20,000. If the molecular weight is greater than this range, then the solubility of the component in the resist solvent may deteriorate, whereas if the molecular weight is too small, there is a danger of a deterioration in the dry etching resistance and the cross sectional shape of the resist pattern.

Up until this point the resin component (A) has been described in detail in relation to a positive resist composition of the fourth aspect, but the resin component (A) can also be ideally employed in a positive resist composition according to either the first aspect or the second aspect.

[Acid Generator Component (B)]

In the first through fourth aspects of the present invention, as the acid generator component (B), a compound appropriately selected from known materials used as acid generators in conventional chemically amplified resists can be used.

Of these possible acid generators, onium salts with a fluorinated alkylsulfonate ion as the anion are preferred. Examples of preferred acid generators include onium salts such as diphenyliodonium trifluoromethanesulfonate, (4-methoxyphenyl)phenyliodonium trifluoromethanesulfonate, bis(p-tert-butylphenyl)iodonium trifluoromethanesulfonate, triphenylsulfonium trifluoromethanesulfonate, (4-methoxyphenyl)diphenylsulfonium trifluoromethanesulfonate, (4-methylphenyl)diphenylsulfonium nonafluorobutanesulfonate, (4-methylphenyl)diphenylsulfonium trifluoromethanesulfonate, (p-tert-butylphenyl)diphenylsulfonium trifluoromethanesulfonate, diphenyliodonium nonafluorobutanesulfonate, bis(p-tert-butylphenyl)iodonium nonafluorobutanesulfonate, triphenylsulfonium nonafluorobutanesulfonate, triphenylsulfonium perfluorooctanesulfonate, (4-trifluoromethylphenyl)diphenylsulfonium trifluoromethanesulfonate, (4-trifluoromethylphenyl)diphenylsulfonium nonafluorobutanesulfonate, tri(p-tert-butylphenyl)sulfonium trifluoromethanesulfonate, and tri(p-tert-butylphenyl)sulfonium nonafluorobutanesulfonate.

Of these, sulfonium salts are preferred, and of the sulfonium salts, onium salts with a fluorinated alkylsulfonate ion with at least 3 carbon atoms as the anion are particularly preferred.

As this component (B), either a single acid generator or a combination of two or more acid generators may be used.

The quantity of the component (B) is typically within a range from 0.5 to 30 parts by weight, and preferably from 1 to 10 parts by weight, per 100 parts by weight of the component (A). At quantities less than 0.5 parts by weight pattern formation does not proceed satisfactorily, whereas if the quantity exceeds 30 parts by weight, achieving a uniform solution becomes difficult, and there is a danger of a deterioration in the storage stability.

[Organic Solvent (C)]

A resist composition according to any of the first through fourth aspects of the present invention can be produced by dissolving the aforementioned resin component or component (A) and the aforementioned component (B), together with optional components (D) and/or component (E) described below, in an organic solvent (C).

The organic solvent (C) may be any solvent capable of dissolving the aforementioned resin component or component (A) and the aforementioned component (B) to generate a uniform solution, and one or more solvents selected from known materials used as the solvents for conventional chemically amplified resists can be used.

Specific examples of the solvent include ketones such as acetone, methyl ethyl ketone, cyclohexanone, methyl isoamyl ketone and 2-heptanone; polyhydric alcohols and derivatives thereof such as ethylene glycol, ethylene glycol monoacetate, diethylene glycol, diethylene glycol monoacetate, propylene glycol, propylene glycol monoacetate, dipropylene glycol, or the monomethyl ether, monoethyl ether, monopropyl ether, monobutyl ether or monophenyl ether of dipropylene glycol monoacetate; cyclic ethers such as dioxane; and esters such as methyl lactate, ethyl lactate, methyl acetate, ethyl acetate, butyl acetate, methyl pyruvate, ethyl pyruvate, methyl methoxypropionate, and ethyl ethoxypropionate. These organic solvents can be used singularly, or as a mixed solvent of two or more different solvents.

In particular, mixed solvents of propylene glycol monomethyl ether acetate (PGMEA) and a polar solvent containing a hydroxyl group or a lactone such as propylene glycol monomethyl ether (PGME), ethyl lactate (EL) or γ-butyrolactone offer improved storage stability for positive resist compositions, and are consequently preferred. In cases in which EL is mixed with PGMEA, the weight ratio of PGMEA:EL is preferably within a range from 6:4 to 4:6.

In case where PGME is mixed with PGMEA, the weight ratio of PGMEA:PGME is typically within a range from 8:2 to 2:8, and preferably from 8:2 to 5:5.

In a resist composition according to any of the first through fourth aspects of the present invention, the quantity of the organic solvent (C) is sufficient to generate a solid fraction concentration for the resist composition of 3 to 30% by weight, and the actual quantity is set in accordance with the desired film thickness of the resist.

[Other Components]

Furthermore, in a resist composition according to any of the first through fourth aspects, in order to improve the resist pattern shape and the long term stability (post exposure stability of the latent image formed by the pattern wise exposure of the resist layer), a nitrogen containing organic compound (D) can be added as a separate, optional component. A multitude of compounds have already been proposed for this nitrogen containing organic compound, and one of these known compounds may be used, although secondary lower aliphatic amines or tertiary lower aliphatic amines are preferred.

Here, a lower aliphatic amine refers to an alkyl or alkyl alcohol amine of no more than 5 carbon atoms, and examples of these secondary and tertiary amines include trimethylamine, diethylamine, triethylamine, di-n-propylamine, tri-n-propylamine, tripentylamine, tridodecylamine, trioctylamine, diethanolamine, triethanolamine and triisopropanolamine, although alkanolamines such as triethanolamine are particularly preferred.

Furthermore, nitrogen containing organic compounds represented by a general formula (VI) shown below can also be favorably employed.

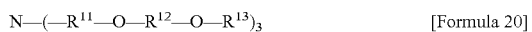

[Formula 20]

(VI)

(wherein, $R^{11}$ and $R^{12}$ each represent, independently, a lower alkylene group, and $R^{13}$ represents a lower alkyl group)

$R^{11}$, $R^{12}$ and $R^{13}$ may be straight chains, branched chains or a cyclic structures, although straight chains and branched chains are preferred.

From the viewpoint of regulating the molecular weight, the number of carbon atoms within each of $R^{11}$, $R^{12}$ and $R^{13}$ is typically within a range from 1 to 5, and preferably from 1 to 3. The number of carbon atoms in $R^{11}$, $R^{12}$ and $R^{13}$ may be either the same or different, and the structures of $R^{11}$ and $R^{12}$ may also be either the same or different.

Examples of compounds represented by the general formula (VI) include tris-(2-methoxymethoxyethyl)amine, tris-2-(2-methoxy(ethoxy))ethylamine, and tris-(2-(2-methoxyethoxy)methoxyethyl)amine. Of these, tris-2-(2-methoxy (ethoxy))ethylamine is preferred.

Of the above nitrogen containing organic compounds, compounds represented by the general formula (VI) are preferred, and tris-2-(2-methoxy(ethoxy))ethylamine in particular has minimal solubility in the solvents used in immersion lithography processes, and is consequently preferred. These compounds can be used singularly, or in combinations of two or more compounds.

These amines are typically added in a quantity within a range from 0.01 to 2.0% by weight relative to the quantity of the resin component or the component (A).

Furthermore, in order to prevent any deterioration in sensitivity caused by the addition of the aforementioned component (D), and improve the resist pattern shape and the long term stability, an organic carboxylic acid, or a phosphorus oxo acid or derivative thereof can also be added as an optional component (E). Either one, or both of the component (D) and the component (E) can be used.

Examples of suitable organic carboxylic acids include malonic acid, citric acid, malic acid, succinic acid, benzoic acid, and salicylic acid.

Examples of suitable phosphorus oxo acids or derivatives thereof include phosphoric acid or derivatives thereof such as esters, including phosphoric acid, di-n-butyl phosphate and diphenyl phosphate; phosphonic acid or derivatives thereof such as esters, including phosphonic acid, dimethyl phosphonate, di-n-butyl phosphonate, phenylphosphonic acid, diphenyl phosphonate and dibenzyl phosphonate; and phosphinic acid or derivatives thereof such as esters, including phosphinic acid and phenylphosphinic acid, and of these, phosphonic acid is particularly preferred.

The component (E) is typically used in a quantity within a range from 0.01 to 5.0 parts by weight per 100 parts by weight of the resin component or the component (A).

Miscible additives can also be added to a resist composition according to any of the first through fourth aspects of the present invention according to need, and examples include additive resins for improving the properties of the resist film, surfactants for improving the ease of application, dissolution inhibitors, plasticizers, stabilizers, colorants and halation prevention agents.

Production of a resist composition according to any of the first through fourth aspects can be conducted by simply mixing and stirring each of the components together using conventional methods, and where required, the composition may also be mixed and dispersed using a dispersion device such as a dissolver, a homogenizer, or a triple roll mill. Furthermore, following mixing, the composition may also be filtered using a mesh or a membrane filter or the like.

[Pattern Formation Method]

Next is a description of a method of forming a resist pattern according to the present invention.

First, a resist composition according to the present invention is applied to the top of a substrate such as a silicon wafer using a spinner or the like, and a prebake (PAB treatment) is then performed.

An organic or inorganic anti-reflective film may also be provided between the substrate and the applied layer of the resist composition, creating a 2-layer laminate.

Furthermore, a 2-layer laminate in which an organic anti-reflective film is provided on top of the applied layer of the resist composition can also be formed, and a 3-layer laminate comprising an additional bottom layer anti-reflective film can also be formed.

The steps up until this point can be conducted using conventional techniques. The operating conditions are preferably set in accordance with the makeup and the characteristics of the resist composition being used.

Subsequently, the resist layer formed from the applied film of the resist composition is subjected to selective liquid immersion lithography through a desired mask pattern. At this time, the region between the resist layer and the lens at the lowermost point of the exposure apparatus is filled with a solvent which has a larger refractive index than the refractive index of air, and the exposure is preferably conducted with this region filled with a solvent which displays a refractive index which is larger than the refractive index of air but smaller than the refractive index of the resist layer. There are no particular restrictions on the wavelength used for the exposure, and an ArF excimer laser, a KrF excimer laser, a $F_2$ laser, or other radiation such as EUV (extreme ultraviolet), VUV (vacuum ultraviolet), electron beam, X-ray or soft X-ray radiation can be used. A resist composition according to the present invention is useful for KrF or ArF excimer lasers, and particularly effective for ArF excimer lasers.

As described above, in a pattern formation method of the present invention, during exposure the region between the resist layer and the lens at the lowermost point of the exposure apparatus is preferably filled with a solvent which displays a refractive index which is larger than the refractive index of air but smaller than the refractive index of the resist composition being used.

Examples of this solvent which displays a refractive index which is larger than the refractive index of air but smaller than the refractive index of the resist composition being used include water and fluorine based inert liquids. Specific examples of these fluorine based inert liquids include liquids containing a fluorine based compound such as $C_3HCl_2F_5$, $C_4F_9OCH_3$, $C_4F_9OC_2H_5$ and $C_5H_3F_7$ as the primary component or perfluoroalkyl compounds with a boiling point within a range from 70 to 180° C. and preferably from 80 to 160° C. Examples of these perfluoroalkyl compounds include perfluoroalkylether compounds and perfluoroalkylamine compounds.

Specifically, a suitable perfluoroalkylether compound is perfluoro(2-butyl-tetrahydrofuran) (boiling point 102° C.), and a suitable perfluoroalkylamine compound is perfluorotributylamine (boiling point 174° C.). Amongst the aforementioned fluorine based inert liquids, liquids with a boiling point that falls within the above range enable the removal of the immersion liquid following completion of the exposure to be performed using a simple method, and are consequently preferred. A resist composition of the present invention is particularly resistant to any deleterious effects caused by water, and displays excellent sensitivity and resist pattern profile. Furthermore, water is preferred in terms of cost, safety, environmental friendliness and flexibility.

Furthermore, there are no particular restrictions on the refractive index of the solvent, provided it is larger than the refractive index of air but smaller than the refractive index of the resist composition being used.

Subsequently, following completion of the exposure step, PEB (post exposure baking) is conducted, and then developing is performed using an alkali developing liquid comprising an aqueous alkali solution. The substrate is then preferably rinsed with pure water. This water rinse is conducted by dripping or spraying water onto the surface of the substrate while it is rotated, and washes away developing liquid and those sections of the resist composition that have been dissolved by the developing liquid and removes them from the surface of the substrate. By conducting a subsequent drying treatment, a resist pattern is obtained in which the film of the resist composition has been patterned into a shape corresponding with the mask pattern.

By forming a resist pattern in this manner, a resist pattern with an ultra fine line width, and in particular a line and space (L&S) pattern with a small pitch, can be produced with good resolution.

In this description, the pitch of a line and space pattern is the combined distance of a resist pattern width and a space width in a direction across the width of the pattern lines.

Because a resist composition according to the first aspect of the present invention has an aforementioned maximum increase in film thickness of no more than 1.0 nm, because a positive resist composition according to either the second or third aspects of the present invention displays an absolute value for either $[(X2/X1)-1] \times 100$ or $[(X2'/X1')-1] \times 100$ respectively that is no more than 8.0, and because a positive resist composition according to the fourth aspect of the present invention comprises a resin component (A) that contains an aforementioned structural unit (a1) but contains no units (a0), even if the resist composition contacts a solvent which has a refractive index which is larger than the refractive index of air but smaller than the refractive index of the resist composition being used, a high precision resist pattern can be obtained which displays no surface roughening of the resist pattern such as the formation of T-top patterns, and displays minimal deterioration in sensitivity, little swelling, and an excellent resist pattern profile.

EXAMPLES

As follows is a description of examples of the present invention, although the present invention is in no way restricted to the examples presented below.

In the examples and comparative examples described below, unless otherwise stated the simulated immersion lithography and the sensitivity measurements are conducted in the following manner.

(1) Conditions for Forming the Applied Resist Film
Substrate: 8 inch silicon wafer;
Resist application method: application using a spinner onto a substrate rotating at 2000 rpm;
Size of the resist film: diameter of 6 inches, concentric with the substrate, thickness 150 nm;
Prebake conditions: temperature set to a value that produces a 1:1 line and space pattern of 130 nm;
Selective exposure conditions: exposure conducted using an ArF excimer laser (193 nm) (exposure apparatus NSR-S302B, manufactured by Nikon Corporation, NA (numerical aperture)=0.60, 2/3 annular illumination).

(2) Conditions for Contact between Applied Resist Film and Solvent
Rotational speed of substrate: 500 rpm;
Solvent: water;
Solvent dripping rate: 1.0 L/minute
Solvent dripping time: 2 minutes
Temperature of contact between solvent and resist: 23□C.

(3) Conditions for Forming the Resist Pattern
Post exposure baking conditions: temperature set to a value that produces a 1:1 line and space pattern of 130 nm;
Alkali developing conditions: 60 seconds developing at 23□C in a 2.38% by weight aqueous solution of tetramethylammonium hydroxide.

In the examples and comparative examples described below, the specific conditions associated with the method of measuring variations in the film thickness using a quartz oscillator method are described below. Gold is deposited onto one surface of a 1 inch diameter quartz substrate using vacuum deposition, the substrate is positioned with this gold deposition surface facing upwards and rotated at a rate of 2000 rpm, and a spinner is then used to apply a sufficient quantity of the resist composition to the gold deposition surface to generate a dried film of thickness 150 nm. The film is then dried for 90 seconds at 115° C., a portion of the resist is peeled so that the substrate electrode and the socket electrode come in contact, and the film is then either exposed using an ArF excimer laser (193 nm) (exposure apparatus NSR-S302, manufactured by Nikon Corporation, NA (numerical aperture)=0.60, 2/3 annular illumination) or left unexposed, is subsequently immersed in pure water at 23° C., and in this state of immersion the variation in the thickness of the film is measured by a quartz oscillator method at an oscillating frequency of 5 MHz (megahertz).

Example 1

A component (A), a component (B) and a component (D) described below were dissolved uniformly in a component (C), yielding a positive resist composition 1.

As the component (A), 100 parts by weight of a methacrylate-acrylate copolymer comprising the three structural units shown in the [formula 21] was used. The proportions p, q and r of each of the structural units used in preparing the component (A) were p=50 mol %, q=30 mol % and r=20 mol % respectively. This copolymer contained no structural units containing an anhydride of a dicarboxylic acid, and no structural units containing a phenolic hydroxyl group. The weight average molecular weight of the thus prepared component (A) was 10,000.

[FORMULA 21]

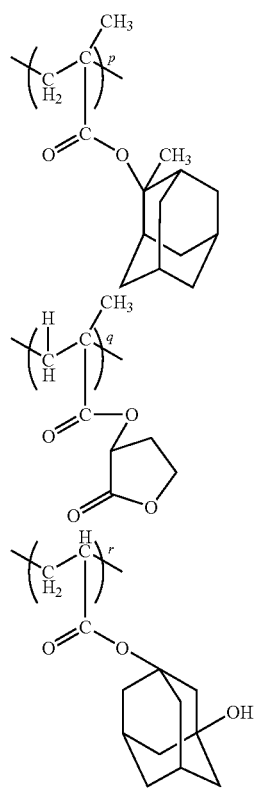

As the component (B), 3.5 parts by weight of triphenylsulfonium nonafluorobutanesulfonate and 1.0 parts by weight of (4-methylphenyl)diphenylsulfonium trifluoromethanesulfonate were used.

As the component (C), 1900 parts by weight of a mixed solvent of propylene glycol monomethyl ether acetate and ethyl lactate (weight ratio 6:4) was used.

As the component (D), 0.3 parts by weight of triethanolamine was used.

Next, using the thus obtained resist composition 1, a resist pattern was formed.

First, an organic anti-reflective film composition AR-19 (manufactured by Shipley Co., Ltd.) was applied to the surface of a silicon wafer using a spinner, and was then baked and dried at 215° C. for 60 seconds on a hotplate, thereby forming an anti-reflective film layer with a film thickness of 82 nm. The positive resist composition 1 obtained above was applied on top of the anti-reflective film using a spinner, and was then prebaked and dried on a hotplate at 115° C. for 90 seconds, forming a resist layer with a film thickness of 150 nm on top of the anti-reflective film.

Next, this layer was selectively irradiated with an ArF excimer laser (193 nm) through a mask pattern, using an exposure apparatus NSR-S302B (manufactured by Nikon Corporation, NA (numerical aperture)=0.60, □=0.75). Then, a simulated immersion lithography treatment was conducted by rotating the silicon wafer comprising the exposed resist layer while pure water was dripped onto the surface for a period of 5 minutes at 23□C.

A PEB treatment was then performed at 115° C. for 90 seconds, and the resist layer was then developed for 60 seconds in an alkali developing liquid at 23° C. As the alkali developing liquid, a 2.38% by weight aqueous solution of tetramethylammonium hydroxide was used.

The resulting resist pattern with a 1:1 line and space pattern of 130 nm was inspected using a scanning electron microscope (SEM), and the sensitivity at that point (Eop) was also determined.

For the resist composition 1 of this example the Eop value was 12.7 mJ/cm$^2$. This value is X2. Furthermore, the resist pattern was of a favorable shape with no T-top shapes and no visible surface roughness.

On the other hand, when the resist composition 1 of this example was used to form a resist pattern using a normal exposure lithography process in which the aforementioned simulated immersion lithography treatment was not performed, in other words, conducting the resist pattern formation using the same process as that described above but with the exception of not conducting the simulated immersion lithography treatment, the value of Eop was 12.4 mJ/cm$^2$. This value is X1.

Determining the absolute value from the formula [(X2/X1)−1]×100 revealed a value of 2.4. When the ratio of the sensitivity of the simulated immersion lithography treatment relative to the sensitivity for normal exposure was determined, the result was 12.7/12.4, or 1.02. Furthermore, the resist pattern was of a favorable shape with no T-top shapes and no visible surface roughness.

Example 2

A component (A), a component (B), a component (D) and the other component described below were dissolved uniformly in a component (C), yielding a positive resist composition 2.

As the component (A), 100 parts by weight of a methacrylate copolymer comprising the three structural units shown in the [formula 22] was used. The proportions p, q and r of each of the structural units used in preparing the component (A) were p=40 mol %, q=40 mol % and r=20 mol % respectively. This copolymer contained no structural units containing an anhydride of a dicarboxylic acid, and no structural units containing a phenolic hydroxyl group. The weight average molecular weight of the thus prepared component (A) was 10,000.

[FORMULA 22]

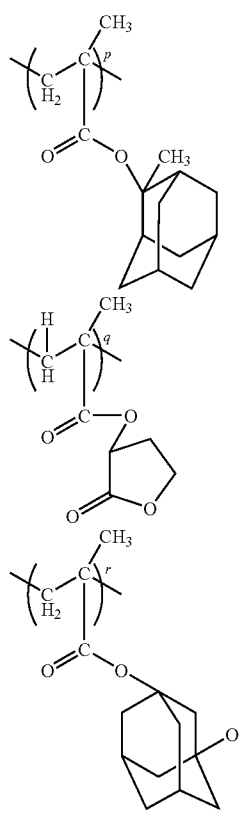

As the component (B), 2.0 parts by weight of (4-methylphenyl)diphenylsulfonium nonafluorobutanesulfonate and 0.8 parts by weight of tri(p-tert-butylphenyl)sulfonium trifluoromethanesulfonate were used.

As the component (C), 700 parts by weight of a mixed solvent of propylene glycol monomethyl ether acetate and propylene glycol monomethyl ether (weight ratio 6:4) was used.

As the component (D), 0.3 parts by weight of triethanolamine was used. Furthermore, as the other component, 25 parts by weight of γ-butyrolactone was used.

Using the thus prepared positive resist composition 2, a resist pattern was formed in the same manner as the example 1, including the simulated immersion lithography treatment. The resulting resist pattern with a 1:1 line and space pattern of 130 nm was inspected using a scanning electron microscope (SEM), and the sensitivity at that point (Eop) was also determined. The Eop value was 20.3 mJ/cm$^2$. This value is X2. Furthermore, the resist pattern was of a favorable shape with no T-top shapes and no visible surface roughness.

On the other hand, when the resist composition 2 of this example was used to form a resist pattern using a normal exposure lithography process in which the aforementioned simulated immersion lithography treatment was not performed, in other words, conducting the resist pattern formation using the same process as that described above but with the exception of not conducting the simulated immersion lithography treatment, the value of Eop was 20.1 mJ/cm$^2$. This value is X1.

Determining the absolute value from the formula [(X2/X1)−1]×100 revealed a value of 1.0. When the ratio of the sensitivity of the simulated immersion lithography treatment relative to the sensitivity for normal exposure was determined, the result was 20.3/20.1, or 1.01. Furthermore, the resist pattern was of a favorable shape with no T-top shapes and no visible surface roughness.

Comparative Example 1

A component (A), a component (B) and a component (D) described below were dissolved uniformly in a component (C), yielding a positive resist composition 10.

As the component (A), 100 parts by weight of a polymer formed from the structural unit shown in the [formula 23] was used. The weight average molecular weight of the thus prepared component (A) was 10,000.

[FORMULA 23]

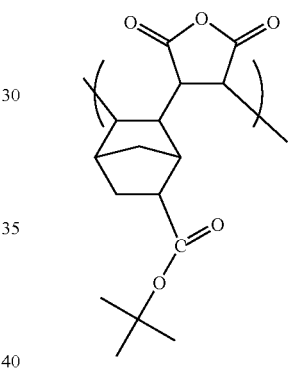

As the component (B), 3.5 parts by weight of triphenylsulfonium nonafluorobutanesulfonate and 1.0 parts by weight of (4-methylphenyl)diphenylsulfonium trifluoromethanesulfonate were used.

As the component (C), 1900 parts by weight of a mixed solvent of propylene glycol monomethyl ether acetate and ethyl lactate (weight ratio 6:4) was used.

As the component (D), 0.3 parts by weight of triethanolamine was used.

Using the thus prepared positive resist composition 10, a pattern was formed in the same manner as the example 1, including the simulated immersion lithography treatment. The resulting resist pattern with a 1:1 line and space pattern of 130 nm was inspected using a scanning electron microscope (SEM), and the sensitivity at that point (Eop) was also determined. The Eop value was 9.1 mJ/cm$^2$. This value is X2. Furthermore, although the resist pattern displayed no T-top shapes, some surface roughness was visible, leaving the resist pattern unsatisfactory.

On the other hand, when the resist composition 10 of this comparative example 1 was used to form a resist pattern using a normal exposure lithography process in which the aforementioned simulated immersion lithography treatment was not performed, in other words, conducting the resist pattern formation using the same process as that described above but with the exception of not conducting the simulated immersion lithography treatment, the value of Eop was 8.4 mJ/cm². This value is X1.

Determining the absolute value from the formula [(X2/X1)−1]×100 revealed a value of 8.3. When the ratio of the sensitivity of the simulated immersion lithography treatment relative to the sensitivity for normal exposure was determined, the result was 9.1/8.4, or 1.08. Furthermore, although the resist pattern displayed no T-top shapes, some surface roughness was visible, leaving the resist pattern unsatisfactory.

From the results of the example 1 and the example 2 it was found that using resist compositions of the present invention and comparing the sensitivity (Eop) for the case of simulated immersion lithography treatment with the case of normal exposure treatment, the absolute value described in the second aspect of the present invention was less than 2 in both cases. In other words, it was evident that a resist composition of the present invention showed little deterioration in sensitivity even when brought in contact with water, and displayed excellent resolution and resist pattern shape with no T-top shapes and no surface roughness, making it ideal for resist pattern formation employing immersion lithography.

In contrast, from the results of the comparative example 1 it was found that with a resist composition that uses a resin with a structural unit that contains an anhydride of a dicarboxylic acid, a comparison of the sensitivity for the case of simulated immersion lithography treatment with the case of normal exposure treatment revealed an absolute value for [(X2/X1)−1]×100 of 8.3. It was revealed that the deterioration in sensitivity was large, surface roughness had developed, and the resist pattern was unsatisfactory, making the resist composition unsuitable for immersion lithography.

Comparative Example 2

A component (A), a component (B), a component (D) and a component (E) described below were dissolved uniformly in a component (C), yielding a positive resist composition 11.

As the component (A), 100 parts by weight of a copolymer comprising 63 mol % of hydroxystyrene units, 24 mol % of styrene units and 13 mol % of tert-butylacrylate units as the structural units was used. The weight average molecular weight of the thus prepared component (A) was 12,000.

As the component (B), 2.8 parts by weight of bis(tert-butylphenyl)iodonium trifluoromethanesulfonate and 1.0 parts by weight of dimethylmonophenylsulfonium trifluoromethanesulfonate were used.

As the component (C), 600 parts by weight of ethyl lactate was used.

As the component (D), 0.26 parts by weight of triethanolamine was used, and as the component (E), 0.28 parts by weight of phenylphosphonic acid was used.

Using the thus prepared positive resist composition 11, a resist pattern was formed.

First, an organic anti-reflective film composition AR-3 (manufactured by Shipley Co., Ltd.) was applied to the surface of a silicon wafer using a spinner, and was then baked and dried at 220° C. for 60 seconds on a hotplate, thereby forming an organic anti-reflective film with a film thickness of 62 nm. The positive resist composition 11 obtained above was applied on top of the anti-reflective film using a spinner, and was then prebaked and dried on a hotplate at 110° C. for 90 seconds, forming a resist layer with a film thickness of 280 nm on top of the anti-reflective film.

Next, this layer was selectively irradiated with a KrF excimer laser (248 nm) through a mask pattern, using an exposure apparatus NSR-S203B (manufactured by Nikon Corporation (NA (numerical aperture)=0.60).

Then, a simulated immersion lithography treatment was conducted by rotating the silicon wafer comprising the exposed resist layer while pure water was dripped onto the surface for a period of 5 minutes at 23° C.

A PEB treatment was then performed at 110° C. for 90 seconds, and the resist layer was then developed for 60 seconds in an alkali developing liquid at 23° C. As the alkali developing liquid, a 2.38% by weight aqueous solution of tetramethylammonium hydroxide was used.

The resulting resist pattern with a 1:1 line and space pattern of 140 nm was inspected using a scanning electron microscope (SEM), and the sensitivity at that point (Eop) was also determined.

The resulting Eop value was 22.0 mJ/cm². This value is X2. Furthermore, the resist pattern was of a T-top shape and surface roughness was visible.

On the other hand, when the resist composition 11 of this example was used to form a resist pattern using a normal exposure lithography process in which the aforementioned simulated immersion lithography treatment was not performed, in other words, conducting the resist pattern formation using the same process as that described above but with the exception of not conducting the simulated immersion lithography treatment, the value of Eop was 20.0 mJ/cm². This value is X1.

Determining the absolute value from the formula [(X2/X1)−1]×100 revealed a value of 10. When the ratio of the sensitivity of the simulated immersion lithography treatment relative to the sensitivity for normal exposure was determined, the result was 22.0/20.0, or 1.1. Furthermore, the resist pattern was of a favorable shape with no T-top shapes and no visible surface roughness.

Comparative Example 3

A component (A), a component (B), a component (D) and a component (E) described below were dissolved uniformly in a component (C), yielding a positive resist composition 12.

As the component (A), a mixed resin containing 70 parts by weight of a copolymer comprising 64 mol % of hydroxystyrene units and 36 mol % of 1-ethoxy-1-ethyloxystyrene units, and 30 parts by weight of a copolymer comprising 67 mol % of hydroxystyrene units and 33 mol % of tetrahydropyranyloxystyrene as the structural units was used. The weight average molecular weight of the thus prepared component (A) was 8,000.

As the component (B), 4 parts by weight of bis(cyclohexylsulfonyl)diazomethane and 1 part by weight of tert-butylphenyliodonium trifluoromethanesulfonate were used.

As the component (C), 600 parts by weight of a mixed solvent of propylene glycol monomethyl ether acetate and ethyl lactate (weight ratio 6:4) was used.

As the component (D), 0.52 parts by weight of triisopropanolamine was used, and as the component (E), 0.54 parts by weight of dodecanoic acid was used.

Using the thus prepared positive resist composition 12, a resist pattern was formed.

First, an organic anti-reflective film composition DUV-44 (a brand name, manufactured by Brewer Science Co., Ltd.) was applied to the surface of a silicon wafer using a spinner, and was then baked and dried at 225° C. for 90 seconds on a hotplate, thereby forming an organic anti-reflective film with a film thickness of 65 nm. The positive resist composition obtained above was applied on top of the anti-reflective film using a spinner, and was then prebaked and dried on a hotplate at 90° C. for 90 seconds, forming a resist layer with a film thickness of 280 nm on top of the anti-reflective film.

Next, this layer was selectively irradiated with a KrF excimer laser (248 nm) through a mask pattern, using an exposure apparatus NSR-S203B (manufactured by Nikon Corporation (NA (numerical aperture)=0.60).

Then, a simulated immersion lithography treatment was conducted by rotating the silicon wafer comprising the exposed resist layer while pure water was dripped onto the surface for a period of 5 minutes at 23° C.

A PEB treatment was then performed at 110° C. for 90 seconds, and the resist layer was then developed for 60 seconds in an alkali developing liquid at 23° C. As the alkali developing liquid, a 2.38% by weight aqueous solution of tetramethylammonium hydroxide was used.

The resulting resist pattern with a 1:1 line and space pattern of 140 nm was inspected using a scanning electron microscope (SEM), and the sensitivity at that point (Eop) was also determined.

The resulting Eop value was 26.3 mJ/cm$^2$. This value is X2. Furthermore, although the resist pattern was not a T-top shape, surface roughness was visible.

On the other hand, when the resist composition 12 of this example was used to form a resist pattern using a normal exposure lithography process in which the aforementioned simulated immersion lithography treatment was not performed, in other words, conducting the resist pattern formation using the same process as that described above but with the exception of not conducting the simulated immersion lithography treatment, the value of Eop was 16.8 mJ/cm$^2$. This value is X1.

Determining the absolute value from the formula [(X2/X1)−1]×100 revealed a value of 56.5. When the ratio of the sensitivity of the simulated immersion lithography treatment relative to the sensitivity for normal exposure was determined, the result was 26.3/16.8, or 1.57. Furthermore, the resist pattern was of a favorable shape with no T-top shapes and no visible surface roughness.

From the results of the comparative example 2 and the comparative example 3 it was found that although the resist pattern formation was conducted using a KrF excimer laser rather than an ArF excimer laser, using resist compositions that employ a resin comprising structural units containing a phenolic hydroxyl group and comparing the Eop values for the case of simulated immersion lithography treatment with the case of normal exposure treatment, the absolute values of [(X2/X1)−1]×100 were 10 and 56.5 respectively. It was evident that the compositions displayed a large deterioration in sensitivity, and developed T-top shapes and surface roughness in the resist pattern, making them completely unsuitable for immersion lithography.

Furthermore, the product "UVII-HS" tested in the non-patent reference 1 mentioned in the description of the related art is similar to the positive resist compositions 11 and 12 used in the comparative examples 2 and 3 respectively in that all three compositions contain phenolic hydroxyl groups within the resin.

In the examples 1 and 2, and the comparative examples 1 to 3, the evaluation test 1 was conducted in which a simulated immersion lithography treatment was conducted by simply dripping water onto the resist, but an actual immersion exposure (immersion lithography) was not performed. However, this evaluation test 1 involves rotating the silicon wafer while pure water is dripped onto the surface for a period of 5 minutes at 23° C., and actually represents more severe conditions than a state of immersion, and consequently if no problems of sensitivity or pattern shape are observed in this evaluation test 1, then it is clear that when actual immersion lithography is conducted, an improvement in the immersion lithography resolution and a broader depth of focus range can be realized.

Example 3, Comparative Example 4

Using the same resist composition 1 as the example 1, but with the exception of altering the resist film thickness to 140 nm, the same method as the example 1 was used to provide a film of the aforementioned AR-19 of thickness 82 nm on top of a substrate (a silicon wafer) and then form a resist layer on top.

Then, as an evaluation test 2, immersion exposure was conducted with a test apparatus manufactured by Nikon Corporation, by carrying out a test using a prism, water and the interference of two beams (a double beam interference test). The same method is disclosed in the aforementioned non-patent reference 2, and this method is widely known as a simple method of obtaining a L&S pattern at the laboratory level.

In the immersion exposure of the example 3, a water solvent layer was formed between the resist layer and the lower surface of the prism as the immersion solvent.

The exposure dose was selected so as to allow stable formation of a L&S pattern. Furthermore, following formation of the resist film on top of the anti-reflective film, a PCD (post coating delay) of approximately 1 hour was introduced, and following exposure, a PED (post exposure delay) of at least 30 minutes was allowed.

In contrast in the comparative example 4, with the exception of not using the water solvent as an immersion solvent, but rather bringing the prism in direct contact with the resist layer, a test was conducted in the same manner as the example 3.

Developing was conducted in the same manner as described for the example 1.

This evaluation test 2 is used for investigating the effect of the water solvent layer on the resist layer, the resolution of the resist pattern, and the pattern profile. Accordingly, if the results obtained for the example 3 are the same as those obtained for the comparative example 4, which uses air, then this indicates that resolution of that resist layer is possible without the water solvent having any effect on the resist layer, and that if immersion lithography is used, then an improvement in the resolution and a broader depth of focus range can be realized, enabling the production of an ultra fine pattern.

The results are shown in Table 1.

TABLE 1

| | Example 3 | | Comparative Example 4 |
|---|---|---|---|
| | Solvent | | |
| | Pure water | Pure water | none (air) |
| Target line width (nm) | 90.0 | 65.0 | 90.0 |
| Target pitch (nm) | 180.0 | 130.0 | 180.0 |
| Line width of obtained pattern (nm) | 91.5 | 65.3 | 90.0 |
| Pitch of obtained pattern (nm) | 184.5 | 128.4 | 177.3 |
| LER (line edge roughness nm) | 5.5 | 4.4 | 7.5 |
| Exposure dose (mJ/cm$^2$) | 3.7 | 6.2 | 3.7 |

As is evident from the results shown in Table 1, the example 3 used the same resist composition 1 as the example 1, and with this type of resist composition, when a line width of 90 nm and a pitch of 180 nm were targeted, the line width and pitch results obtained using pure water were the same as the results obtained for the comparative example 4 using air. When a line width of 65 nm and a pitch of 130 nm were targeted, the comparative test using an air medium was not conducted, but even when water was used, values close to the target were achieved, indicating resolution was possible with no effects caused by the solvent.

Furthermore, the profile in both cases was good. In addition LER (line edge roughness) was less of a problem in the case in which pure water was used than the comparative example 4 in which air was used.

Furthermore, in this double beam interference test, the test environment is such that control of contamination by amines or the like is far less satisfactory than the type of clean room used for normal resist patterning evaluation, but even under these poorer environmental conditions, and even allowing an approximately one hour PCD and a PED treatment of at least 30 minutes, the favorable results described above were still obtained.

Accordingly, if this resist composition is applied to an immersion lithography process, then it is clear that resolution will be possible down to line widths of approximately 50 nm and pitches of approximately 100 nm.

Comparative Examples 5 and 6

In the comparative example 5, the same resist composition 10 as the comparative example 1 was used, and with the exception of altering the resist film thickness to 140 nm, the same method as the comparative example 1 was used to provide a film of the aforementioned AR-19 of thickness 82 nm on top of a substrate (a silicon wafer) and then form a resist layer on top.

Then, in the same manner as the example 3, as an evaluation test 2, immersion exposure was conducted with a test apparatus manufactured by Nikon Corporation, by carrying out a test using a prism, water and the interference of two beams of 193 nm.

In the immersion exposure of this comparative example, a water solvent layer was formed between the resist layer and the lower surface of the prism as the immersion solvent, in the same manner as the example 3.

The exposure dose was selected so as to allow stable formation of an L&S pattern.

In contrast, in the comparative example 6, with the exception of not using the water solvent as an immersion solvent, but rather bringing the prism in direct contact with the resist layer, a test was conducted in the same manner as the comparative example 5.

Developing was conducted in the same manner as described for the comparative example 1.

The results are shown in Table 2.

TABLE 2

| | Comparative Example 5 | Comparative Example 6 |
| --- | --- | --- |
| | Solvent | |
| | Pure water | None (air) |
| Target line width (nm) | 90.0 | 90.0 |
| Target pitch (nm) | 180.0 | 180.0 |
| Line width of obtained pattern (nm) | pattern collapse and T-top shapes, unresolvable | 85.2 |
| Pitch of obtained pattern (nm) | as above, unresolvable | 179.9 |
| Exposure dose (mJ/cm$^2$) | calculation impossible | 3.7 |

From the above results for the comparative examples 5 and 6, the comparative example 1, the examples 1 and 2, the example 3 and the comparative example 4, it is evident that provided the absolute value of the result of the formula [(X2/X1)−1]×100 is no more than 8.0, a favorable resist pattern can be obtained even using immersion exposure, whereas if this value is exceeded, a resist pattern is completely unformable using immersion exposure.

Example 4

A resin component comprising a repeating unit represented by a chemical formula shown below

[FORMULA 24]

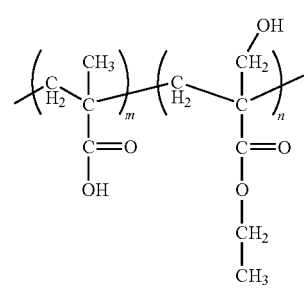

(wherein, m:n is 84:16 (mol %)), 10% by weight, relative to this resin component, of a water insoluble cross linking agent formed from tetrabutoxymethylated glycoluril, 1% by weight of an acid generator formed from triphenylsulfonium nonafluorobutanesulfonate, and 0.6% by weight of an amine component formed from 4-phenylpyridine were dissolved in propylene glycol monomethyl ether, yielding a negative resist composition with a solid fraction component of 8.1% by weight.

Meanwhile, an organic anti-reflective film composition AR-19 (manufactured by Shipley Co., Ltd.) was applied to the surface of a silicon wafer using a spinner, and was then baked and dried at 215° C. for 60 seconds on a hotplate, thereby forming an anti-reflective film layer with a film thickness of 82 nm. The negative resist composition obtained above was applied on top of the anti-reflective film using a spinner, and was then prebaked and dried at 110° C. for 60 seconds, forming a resist layer with a film thickness of 250 nm on top of the anti-reflective film.

Using the same double beam interference exposure apparatus (a test apparatus manufactured by Nikon Corporation) as that used in the example 3 and the comparative example 5, which simulates pattern exposure light by irradiating a double beam of interference light through a prism, and using pure water as the immersion solvent and an ArF excimer laser of wavelength 193 nm as the light source, immersion exposure (the evaluation test 2) was conducted. The lower surface of the apparatus prism contacted the resist film via the pure water.

Following the above exposure, a PEB treatment was then performed at 110° C. for 60 seconds, and the resist layer was then developed for 40 seconds in an alkali developing liquid at 23° C. As the alkali developing liquid, a 2.38% by weight aqueous solution of tetramethylammonium hydroxide was used.

The resulting resist pattern with a 1:1 line and space pattern of 90 nm was inspected using a scanning electron microscope (SEM), and the pattern was favorable with little surface roughness or swelling of the pattern profile.

Example 5

The same procedure as the example 4 was conducted, but rather than performing the immersion exposure (evaluation test 2), a pattern formation that included the same simulated immersion lithography treatment as the example 1 was conducted.

Specifically, first an organic anti-reflective film composition AR-19 (manufactured by Shipley Co., Ltd.) was applied to the surface of a silicon wafer using a spinner, and was then baked and dried at 215° C. for 60 seconds on a hotplate, thereby forming an anti-reflective film layer with a film thickness of 82 nm. The negative resist composition used in the example 4 was applied on top of the anti-reflective film using a spinner, and was then prebaked and dried on a hotplate at 110° C. for 60 seconds, forming a resist layer with a film thickness of 300 nm on top of the anti-reflective film.

Next, this layer was selectively irradiated with an ArF excimer laser (193 nm) through a phase shift mask, using an ArF exposure apparatus NSR-S302B (manufactured by Nikon Corporation (NA (numerical aperture)=0.60, 2/3 annular illumination). Then, a simulated immersion lithography treatment was conducted by rotating the silicon wafer comprising the exposed resist layer while pure water was dripped onto the surface for a period of 2 minutes at 23° C.

A PEB treatment was then performed at 110° C. for 60 seconds, and the resist layer was then developed for 30 seconds in an alkali developing liquid at 23° C. As the alkali developing liquid, a 2.38% by weight aqueous solution of tetramethylammonium hydroxide was used.

The resulting resist pattern with a 1:1 line and space pattern of 160 nm was inspected using a scanning electron microscope (SEM), and the sensitivity at that point (Eop) was also determined.

For the negative resist composition of this example the Eop value was 30.7 mJ/cm$^2$. This value is X2'. Furthermore, the resist pattern was of a favorable shape with no visible surface roughness or swelling.

On the other hand, when the negative resist composition of this example was used to form a resist pattern using a normal exposure lithography process in which the aforementioned simulated immersion lithography treatment was not performed, in other words, conducting the resist pattern formation using the same process as that described above but with the exception of not conducting the simulated immersion lithography treatment, the value of Eop was 30.1 mJ/cm$^2$. This value is X1'.

Determining the absolute value from the formula [(X2'/X1')−1]×100 revealed a value of 2. When the ratio of the sensitivity of the simulated immersion lithography treatment relative to the sensitivity for normal exposure was determined, the result was 30.7/30.1, or 1.02. Furthermore, the resist pattern was of a favorable shape with no visible surface roughness or swelling.

From the results of the examples 4 and 5, it was confirmed that even for a negative resist composition, if the above absolute value is no more than 8.0, such as the 2 observed in the example 5, then as can be seen from the results of the evaluation test 2 of the example 4, a favorable resist pattern can be formed using immersion exposure.

Example 6 (Target Resolution 60 nm and 55 nm)

Using a resist composition 1-(1), which is the same as the resist composition 1 of the example 1 with the exception of having altered the component (D) from triethanolamine to 0.65 parts by weight of tris-2-(2-methoxy(ethoxy))ethylamine, and with the additional exception of having altered the film thickness to 140 nm, the same method as the example 1 was used to form an 82 nm film of the aforementioned AR-19 on top of a substrate (silicon wafer), and then form a resist layer on top.

The same evaluation test 2 as the example 3 (an immersion exposure test conducted using a test apparatus manufactured by Nikon Corporation, by carrying out exposure using a prism, water and the interference of two beams of 193 nm) was then performed. In the same manner as the immersion exposure of the example 3, a water solvent layer was formed between the resist layer and the lower surface of the prism as the immersion solvent.

The exposure dose was selected so as to allow stable formation of a L&S pattern. Developing was conducted in the same manner as the example 1. The results are shown in Table 3.

Example 7 (Target Resolutions 50 nm and 45 nm)

With the exceptions of altering the prebake temperature of the example 6 to 125° C. and altering the resist film thickness to 110 nm, the same method as the example 6 was used to form a resist layer on top of an 82 nm film of AR-19 provided on top of a substrate (silicon wafer). Then, following completion of the same evaluation test 2 as the example 6, a resist pattern was formed in the same manner as the example 6. The results are shown in Table 3.

Example 8 (Target Resolutions 60 nm and 55 nm)

Using a resist composition 1-(2), which is the same as the resist composition 1 of the example 1 with the exception of having altered the component (B) from the mixture of triphenylsulfonium nonafluorobutanesulfonate and (4-methylphenyl)diphenylsulfonium trifluoromethanesulfonate to 5.0 parts by weight of triphenylsulfonium perfluorooctanesulfonate, and with the additional exception of having altered the film thickness to 140 nm, the same method as the example 6 was used to form a resist layer on top of an 82 nm film of AR-19 provided on top of a substrate (silicon wafer). Then, following completion of the same evaluation test 2 as the example 6, a resist pattern was formed in the same manner as the example 6. The results are shown in Table 3.

Example 9 (Target Resolutions 50 nm and 45 nm)

With the exceptions of altering the prebake temperature of the example 8 to 125° C. and altering the resist film thickness to 110 nm, the same method as the example 6 was used to form a resist layer on top of an 82 nm film of AR-19 provided on top of a substrate (silicon wafer). Then, following completion of the same evaluation test 2 as the example 6, a resist pattern was formed in the same manner as the example 6. The results are shown in Table 3.

TABLE 3

|  | Example 6 | | Example 7 | | Example 8 | | Example 9 | |
|---|---|---|---|---|---|---|---|---|
| Solvent | | | | | | | | |
|  | Water | | Water | | Water | | Water | |
| Target line width (resolution nm) | 60 | 55 | 50 | 45 | 60 | 55 | 50 | 45 |
| Target pitch (nm) | 120 | 110 | 100 | 90 | 120 | 110 | 100 | 90 |
| Line width of obtained pattern (resolution nm) | 59.9 | 57.9 | 56.8 | 51.3 | 59.7 | 57.9 | 54.5 | 50.9 |
| Pitch of obtained pattern (nm) | 121.5 | 109.7 | 101.6 | 87.7 | 119.4 | 110.1 | 102.5 | 94.7 |
| LER (line edge roughness nm) | 2.1 | 3.8 | 3.8 | 4.4 | 2.9 | 2.1 | 2.7 | 3.6 |
| Exposure dose (mJ/cm$^2$) | 3.2 | 4.6 | 7.9 | 2.5 | 6.4 | 4.6 | 5.3 | 5.0 |

As is evident from the results shown in Table 3, it became clear that by applying resist compositions of the present invention to immersion lithography, resolution was possible down to target line widths of 45 nm and pitches of 90 nm.

Example 10

A component (A), a component (B) and a component (D) described below were dissolved uniformly in a component (C), yielding a positive resist composition 3.

As the component (A), 100 parts by weight of a methacrylate copolymer comprising the four structural units shown in the [formula 25] was used. The proportions p, q, r and t of each of the structural units used in preparing the component (A) were p=40 mol %, q=40 mol %, r=15 mol % and t=5 mol % respectively. This copolymer contained no structural units containing an anhydride of a dicarboxylic acid, and no structural units containing a phenolic hydroxyl group. The weight average molecular weight of the thus prepared component (A) was 10,000.

[FORMULA 25]

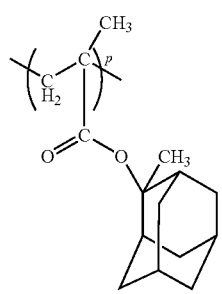
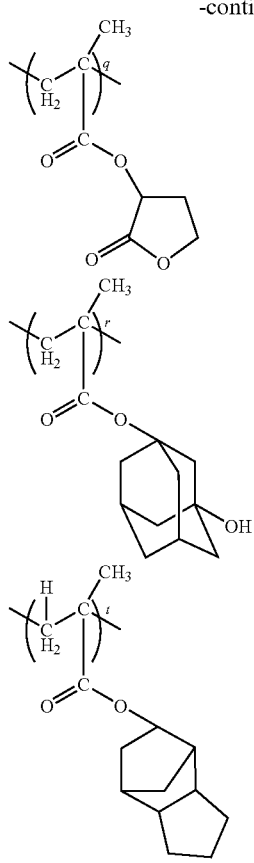

-continued

As the component (B), 5.0 parts by weight of triphenylsulfonium nonafluorobutanesulfonate was used.

As the component (C), 1900 parts by weight of a mixed solvent of propylene glycol monomethyl ether acetate and ethyl lactate (weight ratio 6:4) was used.

As the component (D), 0.3 parts by weight of triethanolamine was used.

Next, using the thus obtained positive resist composition 3, a resist pattern was formed in the same manner as the example 1.

In other words, first an organic anti-reflective film composition AR-19 (manufactured by Shipley Co., Ltd.) was used to form an anti-reflective film layer with a film thickness of 82 nm in the same manner as the example 1. The positive resist composition 3 obtained above was then used to form a resist layer with a film thickness of 150 nm on top of the anti-reflective film, using the same prebake process as the example 1.

Next, this layer was selectively irradiated with an ArF excimer laser (193 nm) through a mask pattern, using an ArF exposure apparatus NSR-S302B (manufactured by Nikon Corporation (NA (numerical aperture)=0.60, σ=0.75). Then, a simulated immersion lithography treatment was conducted by rotating the silicon wafer comprising the exposed resist layer while pure water was dripped onto the surface for a period of 2 minutes at 23° C. In the example 1, this dripping was continued for 5 minutes, but it was discovered that there was no time dependency regardless of whether the dripping was performed for 2 minutes or 5 minutes, and so for the sake of efficiency, a time of 2 minutes was used.

A PEB treatment was then performed at 115° C. for 90 seconds, and the resist layer was then developed for 60 seconds in an alkali developing liquid at 23° C. As the alkali developing liquid, a 2.38% by weight aqueous solution of tetramethylammonium hydroxide was used.

The resulting resist pattern with a 1:1 line and space pattern of 130 nm was inspected using a scanning electron microscope (SEM), and the sensitivity at that point (Eop) was also determined.

For the resist composition 3 of this example the Eop value was 14.32 mJ/cm$^2$. This value is X2. Furthermore, the resist pattern was of a favorable shape with no T-top shapes and no visible surface roughness.

On the other hand, when the resist composition 3 of this example was used to form a resist pattern using a normal exposure lithography process in which the aforementioned simulated immersion lithography treatment was not performed, in other words, conducting the resist pattern formation using the same process as that described above but with the exception of not conducting the simulated immersion lithography treatment, the value of Eop was 14.37 mJ/cm$^2$. This value is X1.

Determining the absolute value from the formula [(X2/X1)−1]×100 revealed a value of 0.3. When the ratio of the sensitivity of the simulated immersion lithography treatment relative to the sensitivity for normal exposure was determined, the result was 14.32/14.37, or 0.997. Furthermore, the resist pattern was of a favorable shape with no T-top shapes and no visible surface roughness.

Example 11

With the exception of altering the component (D) of the positive resist composition 3 of the example 10 from triethanolamine to 0.46 parts by weight of tripentylamine, a positive resist composition 3-(1) was prepared in the same manner as the example 10.

Using the positive resist composition 3-(1) prepared in this manner, pattern formation incorporating a simulated immersion lithography treatment was conducted in the same manner as the example 10. The resulting 1:1 line and space pattern of 130 nm was inspected using a scanning electron microscope (SEM), and the sensitivity at that point (Eop) was also determined. Determining the Eop value revealed a value of 12.79 mJ/cm$^2$. This value is X2. Furthermore, the resist pattern was of a favorable shape with no T-top shapes and no visible surface roughness.

On the other hand, when the positive resist composition 3-(1) of this example was used to form a resist pattern using a normal exposure lithography process in which the aforementioned simulated immersion lithography treatment was not performed, in other words, conducting the resist pattern formation using the same process as that described above but with the exception of not conducting the simulated immersion lithography treatment, the value of Eop was 12.91 mJ/cm$^2$. This value is X1.

Determining the absolute value from the formula [(X2/X1)−1]×100 revealed a value of 0.9. When the ratio of the sensitivity of the simulated immersion lithography treatment relative to the sensitivity for normal exposure was determined, the result was 12.79/12.91, or 0.991. Furthermore, the resist pattern was of a favorable shape with no T-top shapes and no visible surface roughness.

Example 12

With the exception of altering the component (D) of the positive resist composition 3 of the example 10 from triethanolamine to 1.05 parts by weight of tridodecylamine, a positive resist composition 3-(2) was prepared in the same manner as the example 10.

Using the positive resist composition 3-(2) prepared in this manner, pattern formation incorporating a simulated immersion lithography treatment was conducted in the same manner as the example 10. The resulting 1:1 line and space pattern of 130 nm was inspected using a scanning electron microscope (SEM), and the sensitivity at that point (Eop) was also determined. Determining the Eop value revealed a value of 13.81 mJ/cm$^2$. This value is X2. Furthermore, the resist pattern was of a favorable shape with no T-top shapes and no visible surface roughness.

On the other hand, when the positive resist composition 3-(2) of this example was used to form a resist pattern using a normal exposure lithography process in which the aforementioned simulated immersion lithography treatment was not performed, in other words, conducting the resist pattern formation using the same process as that described above but with the exception of not conducting the simulated immersion lithography treatment, the value of Eop was 13.93 mJ/cm$^2$. This value is X1.

Determining the absolute value from the formula [(X2/X1)−1]×100 revealed a value of 0.86. When the ratio of the sensitivity of the simulated immersion lithography treatment relative to the sensitivity for normal exposure was determined, the result was 13.81/13.93, or 0.991. Furthermore, the resist pattern was of a favorable shape with no T-top shapes and no visible surface roughness.

Example 13

With the exception of altering the component (B) of the positive resist composition 1 of the example 1 from the mixture of triphenylsulfonium nonafluorobutanesulfonate and (4-methylphenyl)diphenylsulfonium trifluoromethanesulfonate to 6.5 parts by weight of (p-tert-butylphenyl)sulfonium nonafluorobutanesulfonate, a positive resist composition 1-(3) was prepared in the same manner as the example 1.

Using the positive resist composition 1-(3) prepared in this manner, pattern formation incorporating a simulated immersion lithography treatment was conducted in the same manner as the example 10. The resulting 1:1 line and space pattern of 130 nm was inspected using a scanning electron microscope (SEM), and the sensitivity at that point (Eop) was also determined. Determining the Eop value revealed a value of 22.18 mJ/cm$^2$. This value is X2. Furthermore, the resist pattern was of a favorable shape with no T-top shapes and no visible surface roughness.

On the other hand, when the positive resist composition 1-(3) of this example was used to form a resist pattern using a normal exposure lithography process in which the aforementioned simulated immersion lithography treatment was not performed, in other words, conducting the resist pattern formation using the same process as that described above but with the exception of not conducting the simulated immersion lithography treatment, the value of Eop was 22.56 mJ/cm$^2$. This value is X1.

Determining the absolute value from the formula [(X2/X1)−1]×100 revealed a value of 1.68. When the ratio of the sensitivity of the simulated immersion lithography treatment relative to the sensitivity for normal exposure was determined, the result was 22.18/22.56, or 0.983. Furthermore, the resist pattern was of a favorable shape with no T-top shapes and no visible surface roughness.

From the results of the above examples 10 to 12 it was clear that even if a quaternary copolymer was used, the composition was still suited to immersion lithography processes. Furthermore, from the results of the example 1 and the example 13 it was clear that even with a different acid generator, the composition was still ideally suited to immersion lithography processes.

Example 14

Gold was deposited onto one surface of a 1-inch diameter quartz substrate using vacuum deposition, the substrate was positioned with this gold deposited surface facing upwards and was rotated at a rate of 2000 rpm, and a spinner was then used to apply a sufficient quantity of the positive resist composition 1-(2) used in the example 8 to the gold deposited surface to generate a dried film 150 nm thick. The film was then dried for 90 seconds at 115° C. to form a resist film with a film thickness of 150 nm. The resist was partially peeled off so that the substrate electrode and the socket electrode came into contact. The thus obtained resist film is termed an unexposed film.

On the other hand, a large, visibly detectable area (approximately 10 mm$^2$) of a resist film prepared in the above manner was exposed with an ArF excimer laser (193 nm) using an exposure apparatus NSR-S302B (manufactured by Nikon Corporation (NA (numerical aperture)=0.60, σ=0.75). The exposure dose was 6 mJ/cm$^2$. A PEB treatment was then conducted at 115° C. for 90 seconds. This is termed an exposed film.

Subsequently, the aforementioned unexposed film and exposed film were immersed in pure water that had undergone ion exchange, and with the films in a state of immersion, the variation in the thickness of the films was measured for a maximum measurement period of 300 seconds, using a RDA-QZ3 device manufactured by Lintec Japan Corporation, which is a film thickness measuring device comprising a quartz crystal microbalance (hereafter referred to as a QCM).

Fluctuations in the frequency of the quartz substrate were measured, and the resulting data was processed with the provided analysis software to create a immersion time vs. film thickness graph. The graph for this example is graph-1 (see FIG. 1).

In order to clarify the difference in film thickness variation for the exposed and unexposed samples, each curve in the graph was referenced against the film thickness at an immersion time of 0, and the variation in film thickness from that point was displayed and plotted. In other words, if the thickness decreases from the initial film thickness then a negative value is displayed, whereas if the film thickness increases, a positive value is displayed. The maximum film thickness variation in the positive direction and the maximum variation in the negative direction were determined for each sample. If there was no movement in either the positive or negative direction, then the value for that direction was recorded as 0 nm.

The maximum increase in the film thickness within 10 seconds of commencing measurement of the films was 0 nm for both the unexposed film and the exposed film, whereas the maximum decrease in the film thickness within 10 seconds was 1.16 nm for the unexposed film and 0.66 nm for the exposed film.

Example 15

A positive resist composition 1-(4) was prepared in the same manner as the positive resist composition 1-(2), with the exception of replacing the triethanolamine with 0.46 parts by weight of tripentylamine.

Figure 2:
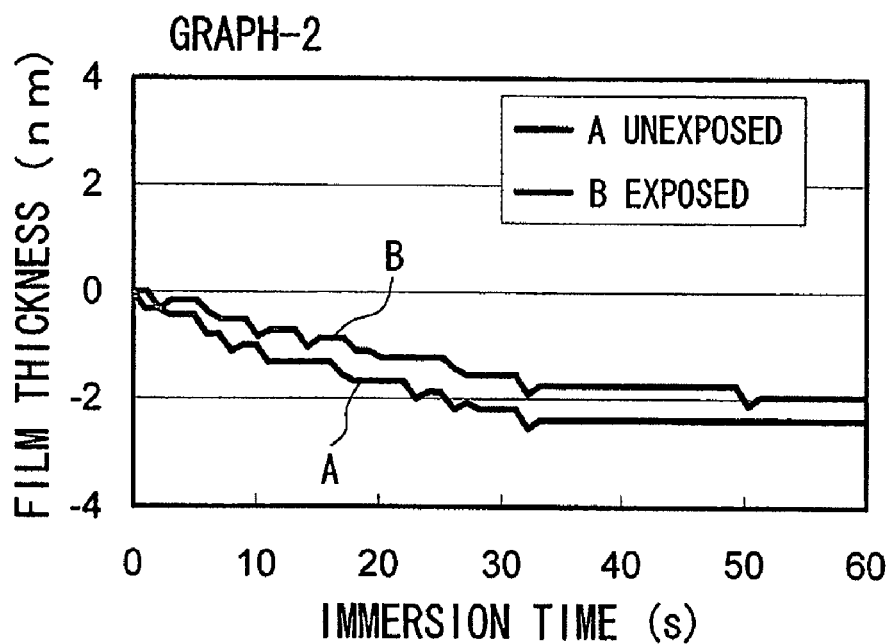
FIG. 2 is a graph showing the results of an example 15.

Subsequently, the variations in the film thickness of an unexposed film and an exposed film were measured using a QCM in the same manner as the example 14, yielding a similar graph of immersion time vs. film thickness. The graph for this example is graph-2 (see FIG. 2).

Furthermore, when the maximum increase in the film thickness within 10 seconds of commencing measurement was determined in the same manner as the example 14, the result was 0 nm for both the unexposed film and the exposed film, whereas the maximum decrease in the film thickness within 10 seconds was 1.00 nm for the unexposed film and 0.52 nm for the exposed film.

Example 16

A positive resist composition 1-(5) was prepared in the same manner as the positive resist composition 1-(2), with the exception of replacing the triethanolamine with 0.71 parts by weight of trioctylamine.

Figure 3:
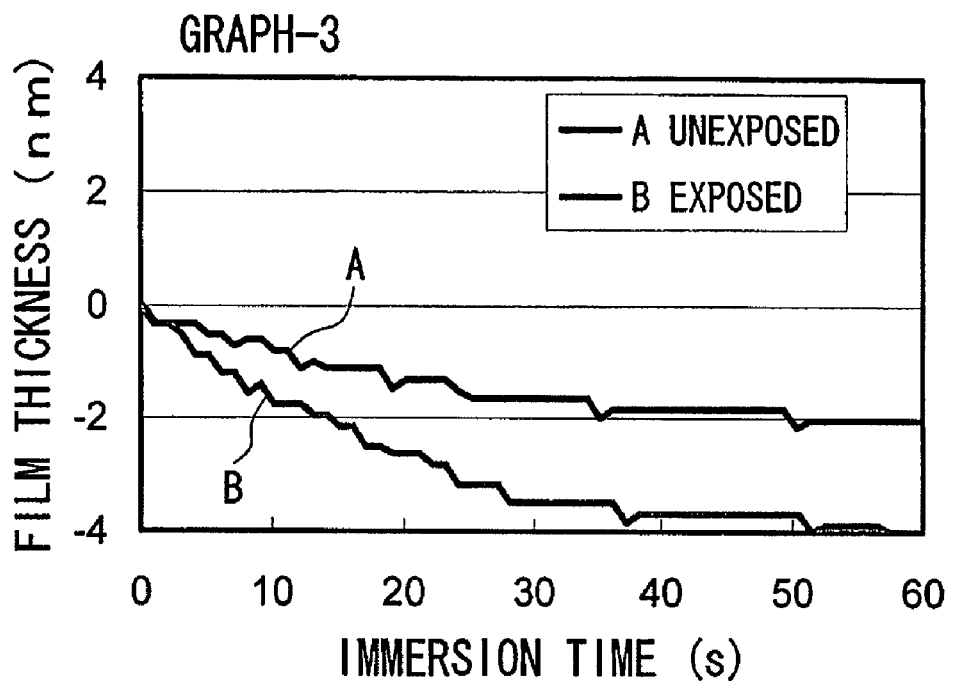
FIG. 3 is a graph showing the results of an example 16.

Subsequently, the variations in the film thickness of an unexposed film and an exposed film were measured using a QCM in the same manner as the example 14, yielding a similar graph of immersion time vs. film thickness. The graph for this example is graph-3 (see FIG. 3).

Furthermore, when the maximum increase in the film thickness within 10 seconds of commencing measurement was determined in the same manner as the example 14, the result was 0 nm for both the unexposed film and the exposed film, whereas the maximum decrease in the film thickness within 10 seconds was 0.81 nm for the unexposed film and 1.75 nm for the exposed film.

Example 17

A positive resist composition 4 was prepared in the same manner as the positive resist composition 1-(2), with the exceptions of replacing the triethanolamine with 0.71 parts by weight of trioctylamine, and replacing the component (A) with a copolymer shown in [formula 26]. The weight average molecular weight of the copolymer was 10,000, and the proportions p, q and r were 30 mol %, 50 mol % and 20 mol % respectively.

[FORMULA 26]

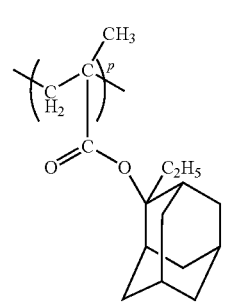

-continued

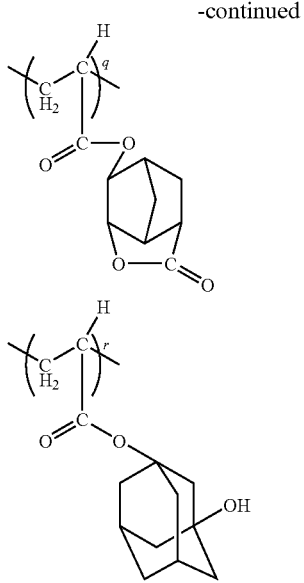

Figure 4:
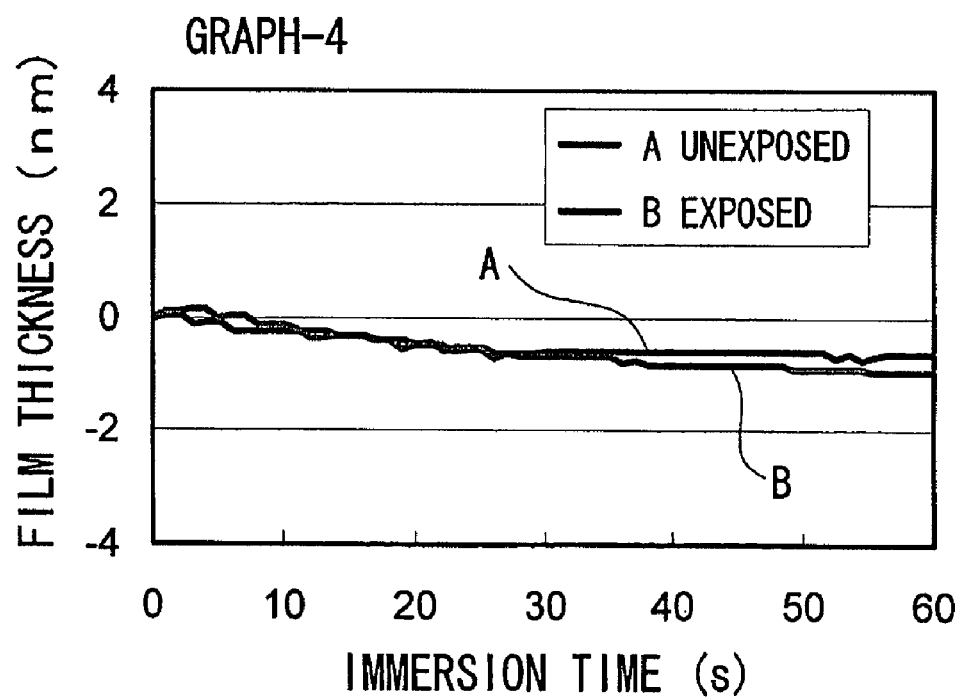
FIG. 4 is a graph showing the results of an example 17.

Subsequently, the variations in the film thickness of an unexposed film and an exposed film were measured using a QCM in the same manner as the example 14, yielding a similar graph of immersion time vs. film thickness. The graph for this example is graph-4 (see FIG. 4).

Furthermore, when the maximum increase in the film thickness within 10 seconds of commencing measurement was determined in the same manner as the example 14, the result was 0.02 nm for the unexposed film and 0.13 nm for the exposed film, whereas the maximum decrease in the film thickness within 10 seconds was 0.26 nm for the unexposed film and 0.15 nm for the exposed film.

Example 18

A positive resist composition 3-(3) was prepared in the same manner as the positive resist composition 3 used in the example 10, with the exception of replacing the triethanolamine with 0.71 parts by weight of trioctylamine.

Figure 5:
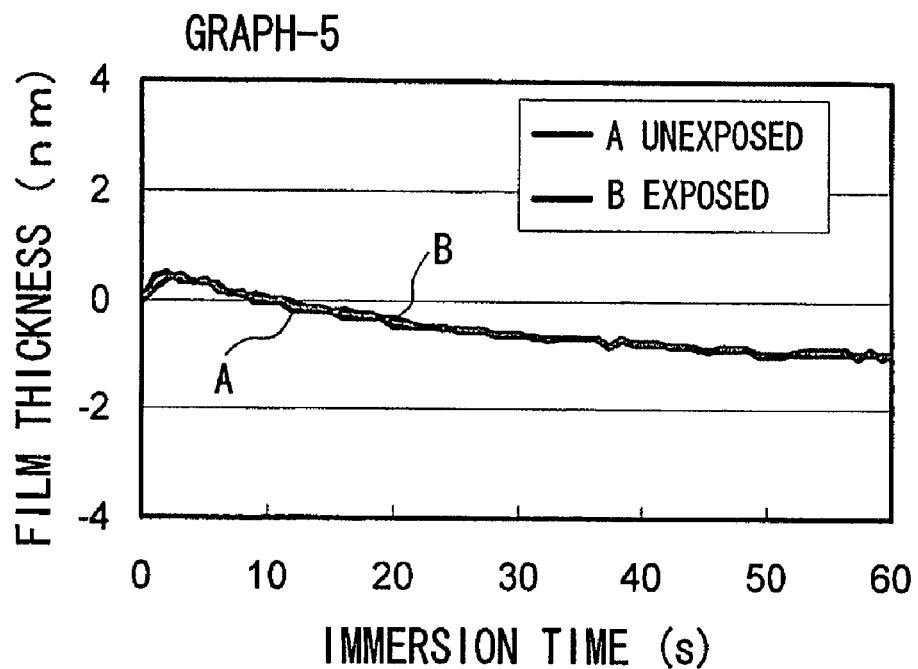
FIG. 5 is a graph showing the results of an example 18.

Subsequently, the variations in the film thickness of an unexposed film and an exposed film were measured using a QCM in the same manner as the example 14, yielding a similar graph of immersion time vs. film thickness. The graph for this example is graph-5 (see FIG. 5).

Furthermore, when the maximum increase in the film thickness within 10 seconds of commencing measurement was determined in the same manner as the example 14, the result was 0.50 nm for the unexposed film and 0.44 nm for the exposed film, whereas the maximum decrease in the film thickness within 10 seconds was 0.04 nm for the unexposed film and 0 nm for the exposed film.

Comparative Example 7

A component (A), a component (B) and a component (D) described below were dissolved uniformly in a component (C), yielding a positive resist composition 13.

As the component (A), a copolymer comprising 64 mol % of hydroxystyrene units and 36 mol % of 1-ethoxy-1-ethyloxystyrene units as the structural units was used. The weight average molecular weight of the thus prepared component (A) was 8,000.

As the component (B), 5 parts by weight of triphenylsulfonium nonafluorobutanesulfonate was used.

As the component (C), 1900 parts by weight of a mixed solvent of propylene glycol monomethyl ether acetate and ethyl lactate (weight ratio 6:4) was used.

As the component (D), 0.71 parts by weight of trioctylamine was used.

Next, the positive resist composition 13 was applied to a rotating silicon wafer, and then heated at 90° C. for 90 seconds to form a resist film with a film thickness of 150 nm. This is termed an unexposed film. On the other hand, a large, visibly detectable area (approximately 10 mm$^2$) of a resist film prepared in the above manner was exposed with a KrF excimer laser (248 nm) using an exposure apparatus NSR-S203B (manufactured by Nikon Corporation (NA (numerical aperture)=0.60). The exposure dose was 12 mJ/cm$^2$. A PEB treatment was then conducted at 110° C. for 90 seconds.

Subsequently, the variations in the film thickness of the unexposed film and the exposed film were measured using a QCM in the same manner as the example 14, yielding a similar graph of immersion time vs. film thickness. The graph for this comparative example is graph-6 (see FIG. 6).

Furthermore, when the maximum increase in the film thickness within 10 seconds of commencing measurement was determined in the same manner as the example 14, the result was 0 nm for the unexposed film and 1.55 nm for the exposed film, whereas the maximum decrease in the film thickness within 10 seconds was 0.27 nm for the unexposed film and 0 nm for the exposed film.

Comparative Example 8

A component (A), a component (B) and a component (D) described below were dissolved uniformly in a component (C), yielding a positive resist composition 14.

As the component (A), a copolymer comprising 60 mol % of hydroxystyrene units, 15 mol % of styrene units and 25 mol % of tert-butylacrylate units as the structural units was used. The weight average molecular weight of the thus prepared component (A) was 12,000.

As the component (B), 5 parts by weight of triphenylsulfonium nonafluorobutanesulfonate was used.

As the component (C), 1900 parts by weight of a mixed solvent of propylene glycol monomethyl ether acetate and ethyl lactate (weight ratio 6:4) was used.

As the component (D), 0.71 parts by weight of trioctylamine was used.

Next, the positive resist composition 14 was applied to a rotating silicon wafer, and then heated at 115° C. for 90 seconds to form a resist film with a film thickness of 150 nm. This is termed an unexposed film. On the other hand, a large, visibly detectable area (approximately 10 mm$^2$) of a resist film prepared in the above manner was exposed with a KrF excimer laser (248 nm) using an exposure apparatus NSR-S203B (manufactured by Nikon Corporation (NA (numerical aperture)=0.60). The exposure dose was 12 mJ/cm$^2$. A PEB treatment was then conducted at 115° C. for 90 seconds.

Subsequently, the variations in the film thickness of the unexposed film and the exposed film were measured using a QCM in the same manner as the example 14, yielding a similar graph of immersion time vs. film thickness. The graph for this comparative example is graph-7 (see FIG. 7).

Furthermore, when the maximum increase in the film thickness within 10 seconds of commencing measurement was determined in the same manner as the example 14, the result was 1.13 nm for the unexposed film and 0.22 nm for the exposed film, whereas the maximum decrease in the film thickness within 10 seconds was 0 nm for both the unexposed film and the exposed film.

Comparative Example 9

A positive resist composition 10-(1) was prepared in the same manner as the positive resist composition 10 used in the comparative example 10, with the exceptions of replacing the triethanolamine with 0.71 parts by weight of trioctylamine, and replacing the mixed component (B) with a single component containing only 5 parts by weight of triphenylsulfonium nonafluorobutanesulfonate.

Subsequently, the variations in the film thickness of an unexposed film and an exposed film were measured using a QCM in the same manner as the example 14, yielding a similar graph of immersion time vs. film thickness. The graph for this comparative example is graph-8 (see FIG. 8). Furthermore, when the maximum increase in the film thickness within 10 seconds of commencing measurement was determined in the same manner as the example 14, the result was 0.61 nm for the unexposed film and 1.49 nm for the exposed film, whereas the maximum decrease in the film thickness within 10 seconds was 0 nm for both the unexposed film and the exposed film.

Example 19

A positive resist composition 2-(1) was prepared in the same manner as the positive resist composition 2 used in the example 2, with the exceptions of altering the component (B) from the mixture of onium salts used in the example 2 to 5.0 parts by weight of triphenylsulfonium nonafluorobutanesulfonate, removing the γ-butyrolactone, and using 1900 parts by weight of a mixed solvent of propylene glycol monomethyl ether acetate and ethyl lactate (weight ratio 6:4).

Subsequently, the thus produced positive resist composition 2-(1) was used to form a resist pattern.

First, an organic anti-reflective film composition AR-19 (manufactured by Shipley Co., Ltd.) was applied to the surface of a silicon wafer using a spinner, and was then baked and dried at 215° C. for 60 seconds on a hotplate, thereby forming an anti-reflective film layer with a film thickness of 82 nm. The positive resist composition 2-(1) obtained above was applied on top of the anti-reflective film using a spinner, and was then prebaked and dried on a hotplate at 15° C. for 90 seconds, forming a resist layer with a film thickness of 200 nm on top of the anti-reflective film.

Next, this layer was selectively irradiated with an ArF excimer laser (193 nm) through a mask pattern, using an exposure apparatus NSR-S302B (manufactured by Nikon Corporation (NA (numerical aperture)=0.60, 2/3 annular illumination). Then, a simulated immersion lithography treatment was conducted by rotating the silicon wafer comprising the exposed resist layer while pure water was dripped onto the surface for a period of 2 minutes at 23° C.

A PEB treatment was then performed at 115° C. for 90 seconds, and the resist layer was then developed for 60 seconds in an alkali developing liquid at 23° C. As the alkali developing liquid, a 2.38% by weight aqueous solution of tetramethylammonium hydroxide was used.

The resulting resist pattern with a 1:1 line and space pattern of 130 nm was inspected using a scanning electron microscope (SEM), and the sensitivity at that point (Eop) was also determined.

For the resist composition 2-(1) of this example the Eop value was 18.77 mJ/cm$^2$. This value is X2. Furthermore, the resist pattern was of a favorable shape with no T-top shapes and no visible surface roughness.

On the other hand, when the resist composition 2-(1) of this example was used to form a resist pattern using a normal exposure lithography process in which the aforementioned simulated immersion lithography treatment was not performed, in other words, conducting the resist pattern formation using the same process as that described above but with the exception of not conducting the simulated immersion lithography treatment, the value of Eop was 19.03 mJ/cm$^2$. This value is X1.

Determining the absolute value from the formula $[(X2/X1)-1] \times 100$ revealed a value of 1.4. When the ratio of the sensitivity of the simulated immersion lithography treatment relative to the sensitivity for normal exposure was determined, the result was 19.03/18.77, or 1.01. Furthermore, the resist pattern was of a favorable shape with no T-top shapes and no visible surface roughness.

Examples 20 to 25

Positive resist compositions were prepared in the same manner as the example 19, with the exception of altering the component (A) to each of the resins shown in Table 4.

Subsequently, with the exception of altering the prebake and PEB temperatures to the values shown in Table 4, a sensitivity value X2 obtained by conducting a simulated immersion lithography treatment, and a sensitivity value X1 obtained without conducting the simulated immersion lithography treatment were obtained for each example in the same manner as the example 19. The absolute value was then determined from the formula $[(X2/X1)-1] \times 100$. The results are shown in Table 4. Furthermore, when the simulated immersion lithography treatment was conducted, although there were some minor variations, the resist pattern shape in each of the examples was of a comparatively favorable shape with no T-top shapes and no visible surface roughness.

TABLE 4

|  | Component (A) polymer | Prebake/ PEB (° C.) | X2 | X1 | Absolute value |
|---|---|---|---|---|---|
| Example 20 | [formula 27] weight average molecular weight 10,000 p, q, r = 40, 40, 20 (mol %) | 115/115 | 11.87 | 11.51 | 3.1 |
| Example 21 | [formula 28] weight average molecular weight 10,000 p, q, r = 40, 40, 20 (mol %) | 90/85 | 26.25 | 25.86 | 1.5 |
| Example 22 | [formula 29] weight average molecular weight 10,000 p, q, r = 40, 40, 20 (mol %) | 130/130 | 10.57 | 10.51 | 0.6 |
| Example 23 | [formula 30] weight average molecular weight 10,000 p, q, r = 40, 40, 20 (mol %) | 90/80 | 21.21 | 21.49 | 1.3 |

TABLE 4-continued
| Component (A) polymer | Prebake/ PEB (° C.) | X2 | X1 | Absolute value |
|---|---|---|---|---|
| Example 24 | [formula 31] weight average molecular weight 10,000 p, q, r = 40, 30, 30 (mol %) | 95/90 | 17.54 | 17.02 | 3.0 |
| Example 25 | [formula 32] weight average molecular weight 10,000 p, q, r = 50, 30, 20 (mol %) | 105/100 | 10.19 | 10.36 | 1.6 |
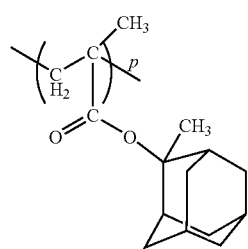
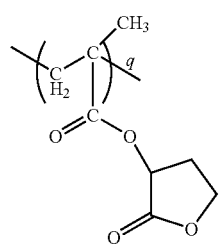
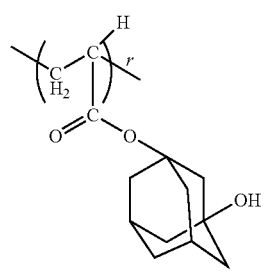
[Formula 27]
[Formula 28]
[Formula 29]

TABLE 4-continued

| Component (A) polymer | Prebake/ PEB (° C.) | X2 | X1 | Absolute value |
|---|---|---|---|---|

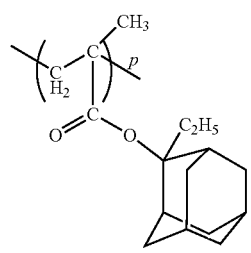

[Formula 30]

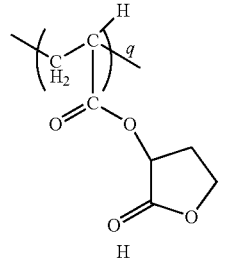

[Formula 31]

TABLE 4-continued

| Component (A) polymer | Prebake/ PEB (° C.) | X2 | X1 | Absolute value |
|---|---|---|---|---|

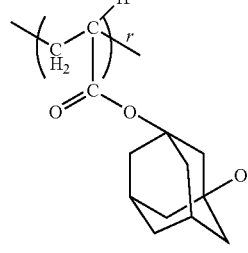

[Formula 32]

Example 26

A component (A), a component (B) and a component (D) described below were dissolved uniformly in a component (C), yielding a positive resist composition.

As the component (A), 100 parts by weight of a methacrylate copolymer comprising the three structural units shown in the [formula 33] was used, in which HS—CH$_2$—CH$_2$—CH$_2$—C(CF$_3$)$_2$—OH had been used as a chain transfer agent to introduce —C(CF$_3$)$_2$—OH groups at the terminals of the copolymer. The proportions p, q and r of each of the structural units used in preparing the component (A) were p=40 mol %, q=40 mol % and r=20 mol % respectively. This copolymer contained no structural units containing an anhydride of a dicarboxylic acid, and no structural units containing a phenolic hydroxyl group. The weight average molecular weight of the thus prepared component (A) was 6,400.

[FORMULA 33]

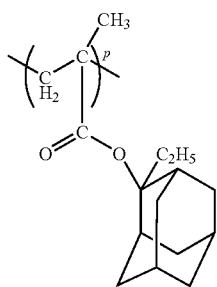

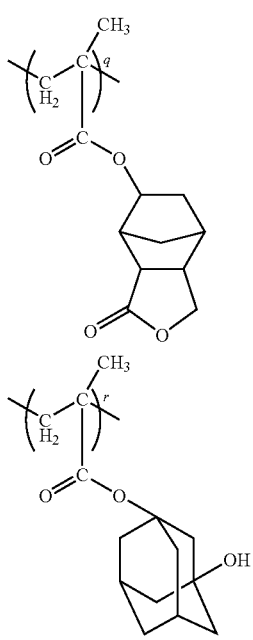

As the component (B), 3.7 parts by weight of triphenylsulfonium nonafluorobutanesulfante 1.0 parts by weight of triphenylsulfonium trifluromethanesulfonate were used.

As the component (C), 900 parts by weight of a mixed solvent of propylene glycol monomethyl ether acetate and ethyl lactate (weight ratio 6:4) was used.

As the component (D), 0.8 parts by weight of tris-2-(2-methoxy(ethoxy))ethylamine was used.

Next, using the thus obtained positive resist composition, a resist pattern was formed.

First, an organic anti-reflective film composition DUV-42 (a brand name, manufactured by Brewer Science Co., Ltd.) was applied to the surface of a silicon wafer using a spinner, and was then baked and dried at 185° C. for 60 seconds on a hotplate, thereby forming an organic anti-reflective film with a film thickness of 65 nm. The positive resist composition obtained above was applied on top of the anti-reflective film using a spinner, and was then prebaked and dried on a hotplate at 125° C. for 90 seconds, forming a resist layer with a film thickness of 350 nm on top of the anti-reflective film.

Next, this layer was selectively irradiated with a KrF excimer laser (248 nm) through a binary mask pattern, using an exposure apparatus NSR-S203B (manufactured by Nikon Corporation (NA (numerical aperture)=0.68, 2/3 annular illumination). Then, a simulated immersion lithography treatment was conducted by rotating the silicon wafer comprising the exposed resist layer while pure water was dripped onto the surface for a period of 2 minutes at 23° C.

A PEB treatment was then performed at 110° C. for 90 seconds, and the resist layer was then developed for 60 seconds in an alkali developing liquid at 23° C. As the alkali developing liquid, a 2.38% by weight aqueous solution of tetramethylammonium hydroxide was used.

The resulting resist pattern with a 1:1 line and space pattern of 150 nm was inspected using a scanning electron microscope (SEM), and the sensitivity at that point (Eop) was also determined.

For the positive resist composition of this example the Eop value was 33.2 mJ/cm$^2$. This value is X2. Furthermore, the resist pattern was of a favorable shape with no T-top shapes and no visible surface roughness.

On the other hand, when the positive resist composition of this example was used to form a resist pattern using a normal exposure lithography process in which the aforementioned simulated immersion lithography treatment was not performed, in other words, conducting the resist pattern formation using the same process as that described above but with the exception of not conducting the simulated immersion lithography treatment, the value of Eop was 32.1 mJ/cm$^2$. This value is X1.

Determining the absolute value from the formula [(X2/X1)−1]×100 revealed a value of 3.4. When the ratio of the sensitivity of the simulated immersion lithography treatment relative to the sensitivity for normal exposure was determined, the result was 33.2/32.1, or 1.03. Furthermore, the resist pattern was of a favorable shape with no T-top shapes and no visible surface roughness.

Furthermore, when a contact hole pattern was formed in the same manner with the exception of replacing the mask with a half tone mask, then regardless of whether the simulated immersion lithography treatment was conducted or not, a hole resist pattern with a hole diameter of 160 nm was formed, and the resist pattern was of a favorable shape with no T-top shapes and no visible surface roughness.

Examples 27 to 31

In each of the examples 27 to 31, a positive resist composition was prepared with a composition shown in Table 5, and with the exception of altering the conditions as shown in Table 6, immersion exposure (the evaluation test 2) was then conducted using the same method as the example 4, namely using a double beam interference exposure apparatus (a test apparatus manufactured by Nikon Corporation) that simulates pattern exposure light by irradiating a double beam of interference light through a prism, and also using pure water as the immersion solvent and an ArF excimer laser with a wavelength of 193 nm as the light source. The results are shown in Table 7.

TABLE 5

| | Component (A) | Component (B) | Component (C) | Component (D) |
|---|---|---|---|---|
| Example 27 | Resin of [formula 21] weight average molecular weight 10,000 p, q, r = 50, 30, 20 (molar ratio) (100 parts by weight) | triphenylsulfonium nonafluorobutanesulfonate (3.5 parts by weight) 4-methylphenyldiphenylsulfonium trifluoromethanesulfonate (1.0 parts by weight) | EL/PGMEA = 4/6 (weight ratio) (2400 parts by weight) | triethanolamine (0.3 parts by weight) |
| Example 28 | Resin of [formula 33] weight average molecular weight 6,400 p, q, r = 40, 40, 20 (molar ratio) (100 parts by weight) | triphenylsulfonium nonafluorobutanesulfonate (3.5 parts by weight) triphenylsulfonium trifluoromethanesulfonate (0.75 parts by weight) | EL/PGMEA = 4/6 (weight ratio) (2400 parts by weight) | tris-2-(2-methoxy(ethoxy))ethylamine (1.2 parts by weight) |
| Example 29 | Resin of [formula 21] weight average molecular weight 10,000 p, q, r = 50, 30, 20 (molar ratio) (100 parts by weight) | triphenylsulfonium nonafluorobutanesulfonate (10 parts by weight) | EL/PGMEA = 4/6 (weight ratio) (2400 parts by weight) | trioctylamine (1.42 parts by weight) |
| Example 30 | Resin of [formula 34] weight average molecular weight 8,900 p, q, r = 40, 40, 20 (molar ratio) (100 parts by weight) | triphenylsulfonium nonafluorobutanesulfonate (7 parts by weight) | EL/PGMEA = 4/6 (weight ratio) (2400 parts by weight) | tris-2-(2-methoxy(ethoxy))ethylamine (1.0 parts by weight) |
| Example 31 | Resin of [formula 34] weight average molecular weight 14,000 p, q, r = 50, 30, 20 (molar ratio) (100 parts by weight) | triphenylsulfonium nonafluorobutanesulfonate (7 parts by weight) | EL/PGMEA = 4/6 (weight ratio) (2400 parts by weight) | tris-2-(2-methoxy(ethoxy))ethylamine (1.0 parts by weight) |

TABLE 6

| | Substrate | Organic anti-reflective film | Anti-reflective film formation conditions | Resist film thickness | PAB | PEB | Developing |
|---|---|---|---|---|---|---|---|
| Example 27 | 8 inch silicon wafer | ARC29 (film thickness 77 nm) | 205° C./60 sec. | 110 nm | 125° C./90 sec. | 115° C./90 sec. | 2.38% TMAH (23° C./60 sec.) |
| Example 28 | 8 inch silicon wafer | ARC29 (film thickness 77 nm) | 205° C./60 sec. | 110 nm | 125° C./90 sec. | 115° C./90 sec. | 2.38% TMAH (23° C./60 sec.) |
| Example 29 | 8 inch silicon wafer | ARC29 (film thickness 77 nm) | 205° C./60 sec. | 110 nm | 90° C./90 sec. | 115° C./90 sec. | 2.38% TMAH (23° C./60 sec.) |
| Example 30 | 8 inch silicon wafer | ARC29 (film thickness 77 nm) | 205° C./60 sec. | 110 nm | 100° C./90 sec. | 115° C./90 sec. | 2.38% TMAH (23° C./60 sec.) |
| Example 31 | 8 inch silicon wafer | ARC29 (film thickness 77 nm) | 205° C./60 sec. | 110 nm | 100° C./90 sec. | 115° C./90 sec. | 2.38% TMAH (23° C./60 sec.) |

TABLE 7

| | Example 27 | Example 28 | Example 29 | Example 30 | Example 31 |
|---|---|---|---|---|---|
| | Solvent | | | | |
| | Water | Water | Water | Water | Water |
| Target line width (resolution nm) | 55 | 55 | 55 | 55 | 55 |
| Target pitch (nm) | 110 | 110 | 110 | 110 | 110 |
| Line width of obtained pattern (resolution nm) | 47.9 | 54.5 | 56.7 | 71.8 | 56 |
| Pitch of obtained pattern (nm) | 109.5 | 111.5 | 110.8 | 111.6 | 108.7 |
| LER (line edge roughness) | 3.6 | 3.1 | 2.4 | 5.4 | 3.8 |
| Exposure dose (mJ/cm$^2$) | 3.2 | 6.4 | 3.2 | 3.2 | 3.2 |

As is evident from the results shown in Table 7, when these resist compositions were applied to immersion lithography, it was clear that resolution was possible down to line widths of approximately 55 nm and pitches of approximately 110 nm. Furthermore, the resist pattern shapes also displayed good levels of rectangularity, and the LER was also favorable.

Example 32

Using the resist composition of the example 1, but with the exception of not forming the anti-reflective film, a resist film with a film thickness of 150 nm was formed in the same manner as the example 1. With this resist film completely immersed in water, a simple exposure apparatus VUVES4500 (manufactured by Lintec Japan Corporation) was used to perform open frame exposure (exposure without a mask) with an ArF excimer laser (193 nm). A PEB treatment was then performed on a hotplate at 115° C. for 90 seconds, and the resist layer was then developed for 60 seconds in an alkali developing liquid at 23° C. As the alkali developing liquid, a 2.38% by weight aqueous solution of tetramethylammonium hydroxide was used. The sensitivity was 4.5 mJ/cm², and the sections exposed by the light were completely removed.

Comparative Example 10

With the exception of not immersing the resist film in water, the same method as the example 32 was used to form a resist film, expose the film, conduct PEB treatment, and then develop the resist. The sensitivity was 4.5 mJ/cm², and the sections exposed by the light were completely removed.

From the results of the example 32 and the comparative example 10 it was evident that the exposure with the resist immersed in water resulted in no major differences from the normal exposure. Accordingly, it can be expected that even when an actual immersion exposure apparatus is used, the resist should not be affected by the immersion solvent.

Example 33

A component (A), a component (B) and a component (D) described below were dissolved uniformly in a component (C), yielding a positive resist composition.

As the component (A), 100 parts by weight of a methacrylate copolymer comprising the three structural units shown below in the [formula 34] was used. The proportions p, q and r of each of the structural units used in preparing the component (A) were p=40 mol %, q=40 mol % and r=20 mol % respectively. This copolymer contained no structural units containing an anhydride of a dicarboxylic acid, and no structural units containing a phenolic hydroxyl group. The weight average molecular weight of the thus prepared component (A) was 8,900.

[FORMULA 34]

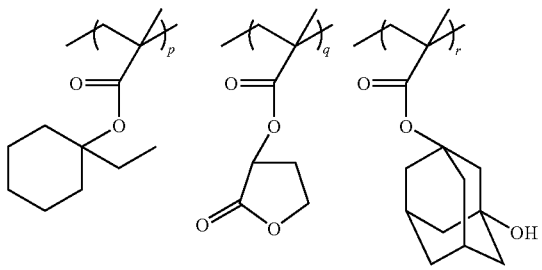

As the component (B), 5.0 parts by weight of triphenylsulfonium nonafluorobutanesulfonate was used.

As the component (D), 0.3 parts by weight of triethanolamine was used.

As the component (C), a mixed solvent of ethyl lactate and propylene glycol monomethyl ether acetate and (weight ratio 4:6) was used, and sufficient quantity was added to generate a resist solid fraction concentration of 4.3% by weight.

Next, using the thus obtained positive resist composition, a pattern formation that incorporated a simulated immersion lithography treatment was performed in the same manner as the example 1, with the exceptions of altering the prebake (PAB) to 90 seconds at 100° C., and altering the PEB to 90 seconds at 110° C. The resulting resist pattern with a 1:1 line and space pattern of 130 nm was inspected using a scanning electron microscope (SEM), and the sensitivity at that point (Eop) was also determined. The resulting Eop value was 15.3 mJ/cm². This value is X2. Furthermore, the resist pattern was of a favorable shape with no visible surface roughness.

On the other hand, when the resist composition of this example was used to form a resist pattern using a normal exposure lithography process in which the aforementioned simulated immersion lithography treatment was not performed, in other words, conducting the resist pattern formation using the same process as that described above but with the exception of not conducting the simulated immersion lithography treatment, the value of Eop was 14.7 mJ/cm². This value is X1.

Determining the absolute value from the formula [(X2/X1)−1]×100 revealed a value of 4.0. When the ratio of the sensitivity of the simulated immersion lithography treatment relative to the sensitivity for normal exposure was determined, the result was 15.3/14.7, or 1.04. Furthermore, the resist pattern was of a favorable shape with no T-top shapes and no visible surface roughness.

Reference Example 1

Using a quartz substrate with no applied resist composition, a measurement using QCM was conducted in the same manner as that described in the example 14, yielding a graph (FIG. 9).

Reference Example 2

Using solutions generated by dissolving samples of polystyrene and t-butyl methacrylate in a solvent, measurements using QCM were conducted in the same manner as that described in the example 14, yielding a graph (FIG. 10).

There was little variation in film thickness, a result which helps confirm the findings of the present invention.

From the results of all of the examples and comparative examples described above, that is, from the total of the evaluation tests 1, 2 and 3, it is evident that the present invention is extremely suited to immersion lithography.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. An evaluation method of a resist composition used in a resist pattern formation method including an immersion exposure comprising the following steps in order:
   forming a resist film from the resist composition;
   subjecting the film to selective exposure;
   bringing an immersion solvent used in the immersion exposure in contact with the film;
   subjecting the film to post exposure baking;
   developing the film; and
   evaluating the resulting resist pattern.

2. The evaluation method of a resin composition according to claim 1, wherein said solvent has a refractive index which is larger than a refractive index of air but smaller than a refractive index of said resist pattern.

3. The evaluation method of a resist composition according to claim 2, wherein said solvent is water.

* * * * *

UNITED STATES PATENT AND TRADEMARK OFFICE
CERTIFICATE OF CORRECTION

PATENT NO.        : 7,541,138 B2
APPLICATION NO. : 11/621895
DATED              : June 2, 2009
INVENTOR(S)      : Hirayama et al.

It is certified that error appears in the above-identified patent and that said Letters Patent is hereby corrected as shown below:

Title Page (Item 56), Col. 2, Line 21, under Other Publications, change "Enginereing" to --Engineering--.

Page 2 (Item 56), Col. 2, Line 24, under Other Publications, change "Applicaton" to --Application--.

Page 2 (Item 56), Col. 2, Line 26, under Other Publications, change "Applicaton" to --Application--.

Page 2 (Item 56), Col. 2, Line 28, under Other Publications, change "Applicaton" to --Application--.

Column 15, Line 26 (Approx.), change "(wherein" to --(wherein,--.

Column 20, Line 17, after "(A)." delete "p".

Column 20, Lines 17-19, delete "Preferred examples of..........[formula 19]." and insert the same, on Col. 20, line 18, below "component (A)." as a new paragraph.

Column 47, Line 46 (Approx.), change "15° C." to --115° C.--.

Column 53, Line 45 (Approx.), change "nonafluorobutanesulfante" to --nonafluorobutanesulfonate--.

UNITED STATES PATENT AND TRADEMARK OFFICE
CERTIFICATE OF CORRECTION

PATENT NO.         : 7,541,138 B2
APPLICATION NO. : 11/621895
DATED               : June 2, 2009
INVENTOR(S)       : Hirayama et al.

It is certified that error appears in the above-identified patent and that said Letters Patent is hereby corrected as shown below:

Column 53, Line 46 (Approx.), change "trifluromethanesulfonate" to --trifluoromethanesulfonate--.

Signed and Sealed this

Twenty-ninth Day of December, 2009

David J. Kappos
*Director of the United States Patent and Trademark Office*